(12) United States Patent
Yamada et al.

(10) Patent No.: US 8,928,422 B2
(45) Date of Patent: Jan. 6, 2015

(54) RESONATOR ELEMENT, RESONATOR, OSCILLATOR, AND ELECTRONIC APPARATUS

(71) Applicant: Seiko Epson Corporation, Tokyo (JP)

(72) Inventors: Akinori Yamada, Ina (JP); Shuhei Yoshida, Minowa-machi (JP); Masaru Mikami, Minowa-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/945,168

(22) Filed: Jul. 18, 2013

(65) Prior Publication Data

US 2014/0022024 A1   Jan. 23, 2014

(30) Foreign Application Priority Data

Jul. 19, 2012  (JP) ................. 2012-160317

(51) Int. Cl.
*H03B 5/32* (2006.01)
*H03B 5/30* (2006.01)

(52) U.S. Cl.
CPC ...................... *H03B 5/30* (2013.01)
USPC .............. 331/158; 351/107 R; 351/116 R; 351/154; 310/370

(58) Field of Classification Search
USPC .......... 331/107 R, 116 R, 154, 158; 310/344, 310/348, 367, 370
See application file for complete search history.

(56) References Cited

U.S. PATENT DOCUMENTS

| 7,015,631 | B2 | 3/2006 | Hirasawa | |
|---|---|---|---|---|
| 7,084,556 | B1 * | 8/2006 | Dalla Piazza et al. | 310/370 |
| 7,112,914 | B1 * | 9/2006 | Dalla Piazza et al. | 310/348 |
| 7,193,354 | B2 | 3/2007 | Kawashima | |
| 8,304,967 | B2 * | 11/2012 | Takizawa | 310/370 |
| 2003/0067248 | A1 | 4/2003 | Dalla Piazza | |
| 2010/0164331 | A1 | 7/2010 | Yamada | |
| 2010/0171397 | A1 | 7/2010 | Yamada | |
| 2011/0018399 | A1 * | 1/2011 | Murata et al. | 310/346 |

FOREIGN PATENT DOCUMENTS

| EP | 1 732 217 | 12/2006 |
|---|---|---|
| EP | 1 732 219 | 12/2006 |
| EP | 1 732 220 | 12/2006 |
| JP | 2002-141770 | 5/2002 |
| JP | 2003-163568 | 6/2003 |
| JP | 2004-357178 | 12/2004 |
| JP | 2005-039768 | 2/2005 |
| JP | 2005-102138 | 4/2005 |
| JP | 2006-345517 | 12/2006 |
| JP | 2006-345518 | 12/2006 |
| JP | 2006-345519 | 12/2006 |
| JP | 2010-171965 | 8/2010 |
| JP | 2010-171966 | 8/2010 |
| JP | 2011-151568 | 8/2011 |

* cited by examiner

*Primary Examiner* — Robert Pascal
*Assistant Examiner* — Jeffrey Shin
(74) *Attorney, Agent, or Firm* — Harness, Dickey & Pierce, P.L.C.

(57) ABSTRACT

A resonator element includes a base section, at least one pair of vibrating arms protruding from the base section, a support arm protruding from the base section, and a first through hole provided to the support arm, and penetrating the support arm in a thickness direction, and is fixed to an object via an adhesive entering the first through hole.

16 Claims, 20 Drawing Sheets

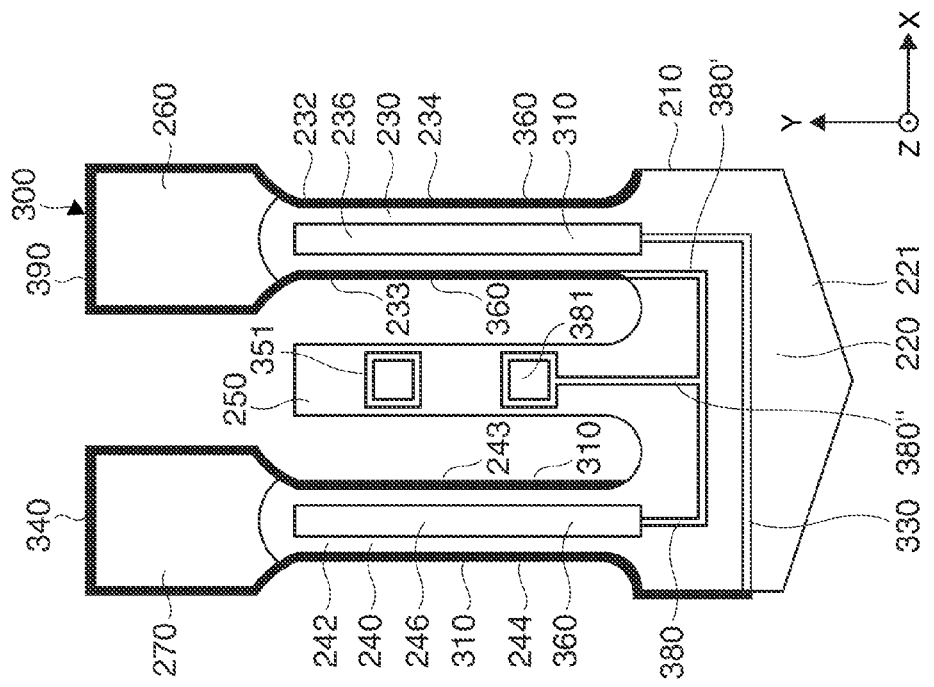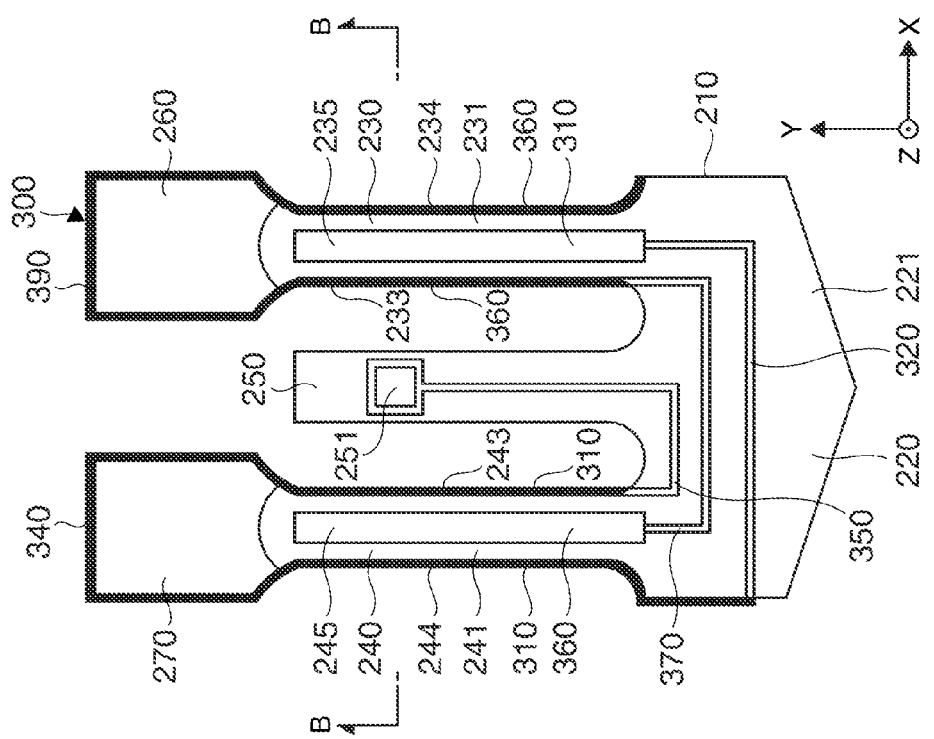

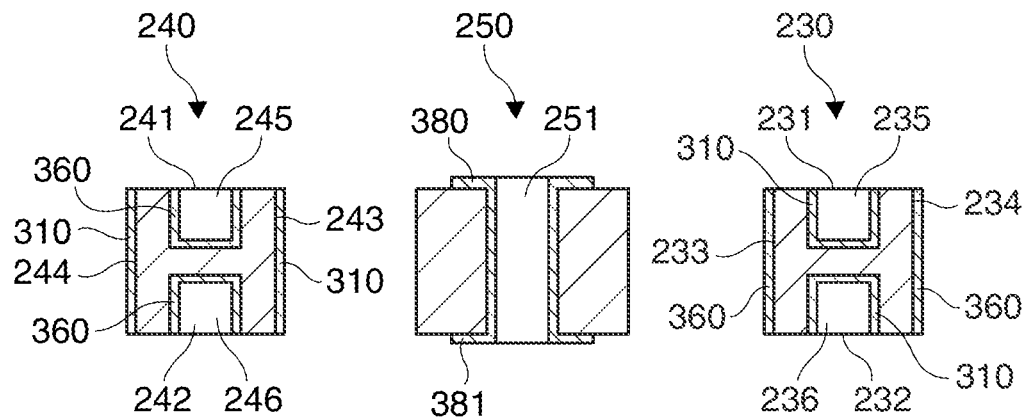
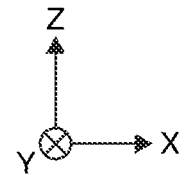
FIG. 4

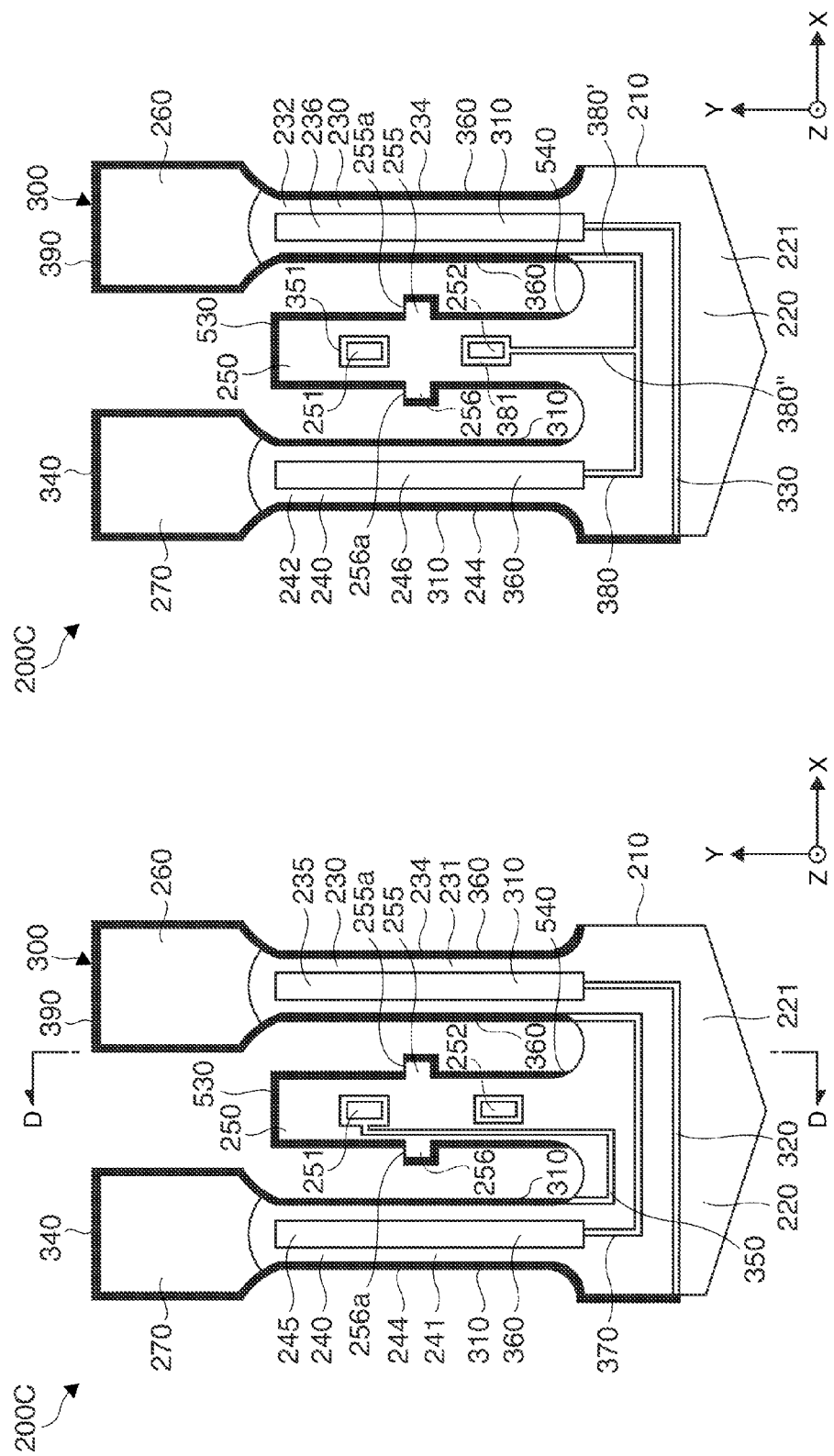

RESONATOR ELEMENT, RESONATOR, OSCILLATOR, AND ELECTRONIC APPARATUS

BACKGROUND

1. Technical Field

The present invention relates to a resonator element, a resonator, an oscillator, and an electronic apparatus.

2. Related Art

In the past, there has been known a quartz crystal oscillator having a resonator element housed in a package (see, e.g., JP-A-2002-141770 (Document 1)). The resonator element provided to the oscillator of Document 1 has a base section, two vibrating arms extending from the base section so as to be arranged in parallel to each other, and a support arm extending from the base section and located between the two vibrating arms. Further, each of the vibrating arms has electrodes formed respectively on four surfaces constituting the periphery of the vibrating arm, and each of the electrodes is connected to either one of two electrically-conductive pads disposed side by side on one of the principal surfaces of the support arm via wiring. Such a resonator element is fixed to the package in the portions of the respective electrically-conductive pads via an electrically-conductive adhesive, and each of the electrically-conductive pads is electrically connected to an electrode of the package via an electrically-conductive adhesive.

However, according to the resonator element with such a configuration, since the contact portions (the electrically-conductive pads) of the resonator element with the electrically-conductive adhesive are each formed to have a planar shape, there is a problem that the contact area between the resonator element and the electrically-conductive adhesive is too small to obtain sufficient bonding strength. It should be noted that although the bonding strength with the resonator element can be increased by applying the electrically-conductive adhesive to a larger area, in such a case, there is a problem that the growth in size of the vibrating element is incurred due to the growth in size of the electrically-conductive adhesive, or the electrically-conductive adhesive has contact with another electrode to cause a short circuit.

SUMMARY

An advantage of some aspects of the invention is to provide a resonator element in which excellent bonding strength with an object (in particular a base substrate of the package) is exerted while inhibiting an adhesive from spreading, a resonator, an oscillator, and an electronic apparatus each equipped with the resonator element.

The invention can be implemented as the following forms or application examples.

Application Example 1

A resonator element according to this application example of the invention includes a base section, at least one pair of vibrating arms protruding from the base section, a support arm protruding from the base section, a first through hole provided to the support arm and penetrating the support arm in a thickness direction between one principal surface and the other principal surface of the support arm, the one principal surface and the other principal surface being in a front-back relationship with each other, a first electrically-conductive pad disposed on the one principal surface of the support arm, and a wiring line extending from the first electrically-conductive pad to the base section passing through the first through hole and on the other principal surface of the support arm, and is fixed to an object with a bonding material entering the first through hole.

According to this application example, since in the state in which the resonator element is fixed to the object via the bonding material such as an adhesive, the adhesive has contact not only with one side of the support arm but also with the inner peripheral surface of the first through hole, the contact area between the support arm and the adhesive can be increased, and thus, the resonator element with excellent bonding strength with respect to the object can be provided. Further, since the adhesive enters the first through hole, the adhesive can be inhibited from spreading. Therefore, in the case in which, for example, the adhesive has electrical conductivity, unwanted short circuit due to the adhesive can be inhibited from occurring.

Application Example 2

In the resonator element according to the above application example of the invention, it is preferable that the resonator element further includes a second electrically-conductive pad disposed at a position closer to a base end of the support arm than the first electrically-conductive pad, and electrically isolated from the first electrically-conductive pad, and the first electrically-conductive pad is disposed in at least a part of a periphery of the first through hole and on at least a part of an inner peripheral surface of the first through hole.

According to this application example, in the case in which, for example, the adhesive has electrical conductivity, electrical conduction between the first electrically-conductive pad and the object can be achieved via the adhesive.

Application Example 3

In the resonator element according to the above application example of the invention, it is preferable that the resonator element further includes a second through hole provided to the support arm, penetrating the support arm in the thickness direction, and positioned closer to the base end of the support arm than the first through hole, and the resonator element is bonded to the object via the first bonding material applied in the first through hole and a second bonding material applied in the second through hole.

According to this application example, the bonding strength with respect to the object is made more excellent.

Application Example 4

In the resonator element according to the above application example of the invention, it is preferable that the second electrically-conductive pad is disposed in at least a part of a periphery of the second through hole and on an inner peripheral surface of the second through hole.

According to this present application example, in the case in which, for example, the adhesive has electrical conductivity, electrical conduction between the second electrically-conductive pad and the object can be achieved via the adhesive.

Application Example 5

A resonator according to this application example of the invention includes the resonator element according to the above application example of the invention, and a package housing the resonator element.

According to this application example, the resonator with high reliability can be obtained.

Application Example 6

An oscillator according to this application example of the invention includes the resonator element according to the above application example of the invention, and an oscillator circuit electrically connected to the resonator element.

According to this application example, the oscillator with high reliability can be obtained.

Application Example 7

An electronic apparatus according to this application example of the invention includes the resonator element according to the above application example of the invention.

According to this application example, the electronic apparatus with high reliability can be obtained.

BRIEF DESCRIPTION OF THE DRAWINGS

The invention will be described with reference to the accompanying drawings, wherein like numbers reference like elements.

FIGS. 3A and 3B are plan views of a resonator element provided to the resonator shown in FIG. 1, wherein FIG. 3A is a top view, and FIG. 3B is a bottom view (a transparent view).

FIG. 4 is a cross-sectional view along the B-B line in FIG. 3A.

FIGS. 7A and 7B are plan views of a resonator element provided to the resonator shown in FIG. 6, wherein FIG. 7A is a top view, and FIG. 7B is a bottom view (a transparent view).

FIGS. 8A and 8B are plan views of a resonator element provided to a resonator according to a third embodiment of the invention, wherein FIG. 8A is a top view, and FIG. 8B is a bottom view (a transparent view).

FIGS. 11A and 11B are plan views of a resonator element provided to a resonator according to a fourth embodiment of the invention, wherein FIG. 11A is a top view, and FIG. 11B is a bottom view (a transparent view).

FIGS. 15A and 15B are plan views of a resonator element provided to a resonator according to a seventh embodiment of the invention, wherein FIG. 15A is a top view, and FIG. 15B is a bottom view (a transparent view).

DESCRIPTION OF EXEMPLARY EMBODIMENTS

Hereinafter, a resonator element, a resonator, an oscillator, and an electronic apparatus according to the invention will be explained in detail based on the embodiments shown in the accompanying drawings.

1. Resonator

Firstly, the resonator (the resonator according to the invention) equipped with the resonator element according to the invention will be explained.

First Embodiment

Figure 1:
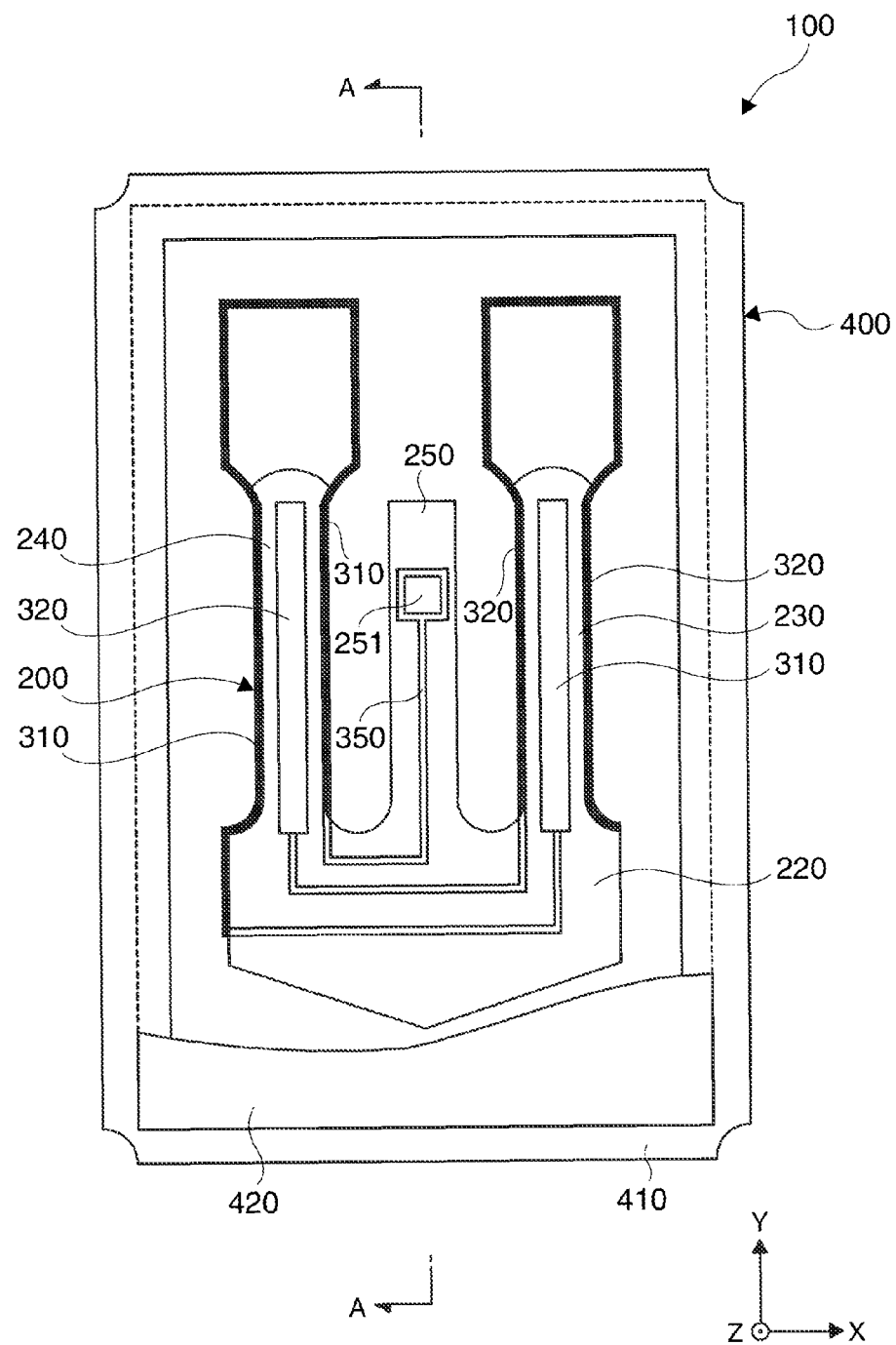
FIG. 1 is a plan view showing a resonator according to a first embodiment of the invention.
Figure 2:
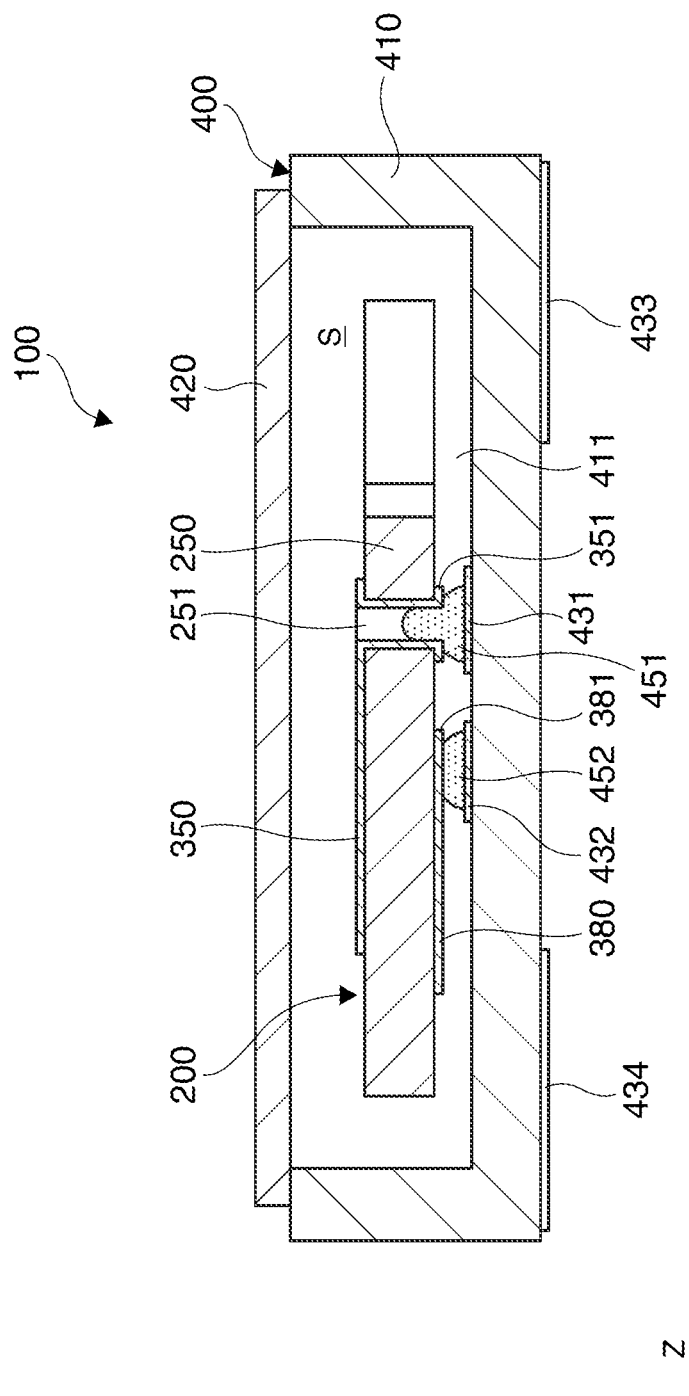
FIG. 2 is a cross-sectional view along the A-A line in FIG. 1.
Figure 5A:
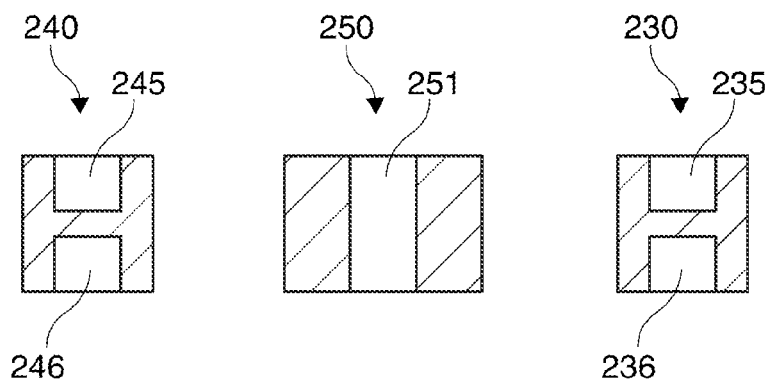
FIGS. 5A through 5C are cross-sectional views for explaining a method of manufacturing the resonator element shown in FIG. 2.
Figure 5B:
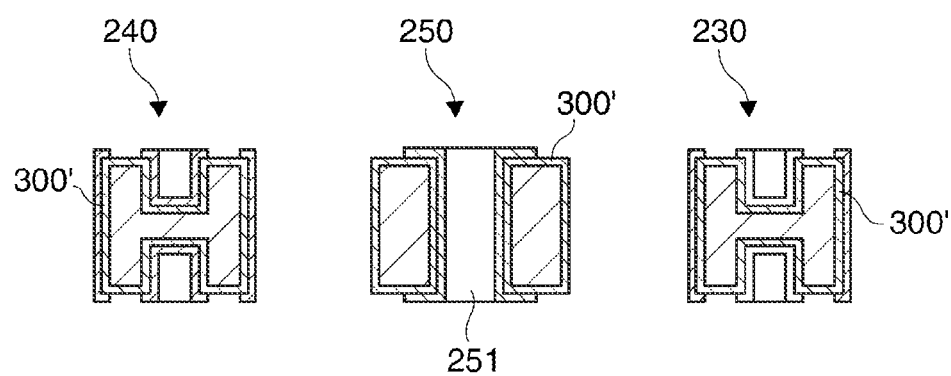
Figure 5C:
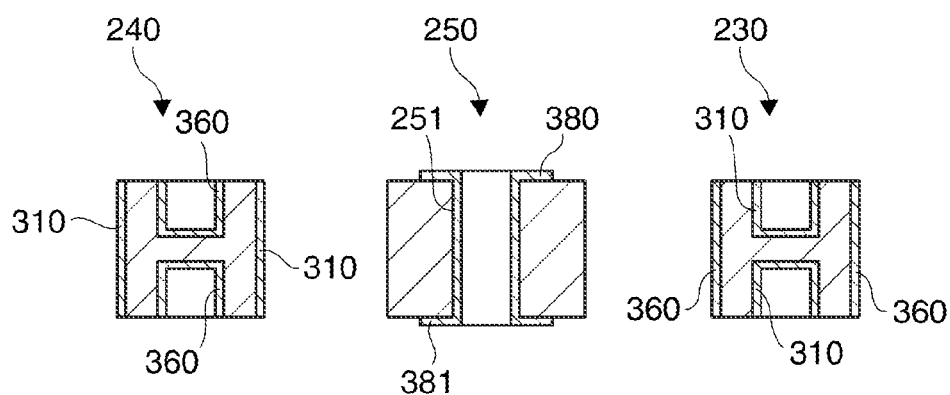

FIG. 1 is a plan view showing a resonator according to a first embodiment of the invention. FIG. 2 is a cross-sectional view along the A-A line in FIG. 1. FIGS. 3A and 3B are plan views of a resonator element provided to the resonator shown in FIG. 1, wherein FIG. 3A is a top view, and FIG. 3B is a bottom view (a transparent view). FIG. 4 is a cross-sectional view along the B-B line in FIG. 3A. FIGS. 5A through 5C are cross-sectional views for explaining a method of manufacturing the resonator element shown in FIG. 2. It should be noted that in each of the drawings, the X axis, the Y axis, and the Z axis are shown as the three axes perpendicular to each other for the sake of convenience of explanation. Further, in the following explanation, the front side of the sheet of FIG. 1 is referred to as an "upper side," and the back side of the sheet is referred to as a "lower side" for the sake of convenience of explanation. Further, for the sake of convenience of explanation, the plan view viewed from the Z-axis direction is also referred to simply as a "plan view."

The resonator 100 shown in FIGS. 1 and 2 has a resonator element 200 and a package 400 housing the resonator element 200. Hereinafter, the resonator element 200, and the package 400 will sequentially be explained in detail.

Package

The package 400 has a base substrate 410 of a cavity type having a recessed section 411 opening upward, and a lid (a lid body) 420 bonded to the base substrate 410 so as to cover the opening of the recessed section 411, and houses the resonator element 200 in the internal space S thereof. It should be noted that the internal space S is preferably sealed airtightly.

The base substrate 410 is formed of a material having an insulating property. Such a material is not particularly limited, and a variety of types of ceramics such as oxide ceramics, nitride ceramics, or carbide ceramics can be used. In contrast, the lid 420 is preferably formed of a member having a linear expansion coefficient similar to that of the constituent material of the base substrate 410. In the case in which the ceramics described above is used as the constituent material of the base 410, an alloy such as kovar can preferably be used as such a material.

The bottom surface of the recessed section 411 is provided with two connection electrodes 431, 432, and the connection electrodes 431, 432 are electrically connected to mounting electrodes 433, 434 formed on the lower surface of the base substrate 410 via penetration electrodes and inter-layer wiring not shown, respectively.

It should be noted that the base substrate 410 can have a plate-like shape, and in such a case, the lid 420 preferably has a concave cap shape in order to form the internal space S.

Resonator Element

As shown in FIGS. 3A and 3B, the resonator element 200 has a vibrating substrate 210, and electrodes 300 for driving formed on the vibrating substrate 210.

The vibrating substrate 210 is formed of quartz crystal, in particular Z-cut quartz crystal, for example, as a piezoelectric plate. Thus, the resonator element 200 can exert superior vibration characteristics. It should be noted that the Z-cut quartz crystal plate is a quartz crystal substrate having the Z axis (the light axis) of the quartz crystal along the thickness direction. Although it is preferable for the Z axis to coincide with the thickness direction of the vibrating substrate 210, it results that the Z axis is tilted slightly (e.g., roughly 15° or smaller) with respect to the thickness direction from the view point of reducing the frequency-temperature variation in the vicinity of the room temperature.

The vibrating substrate 210 has a base section 220, two vibrating arms 230, 240 projecting from the base section 220 in the +Y-axis direction and arranged side by side in the X direction, and a support arm 250 projecting from the base section 220 in the +Y-axis direction, and located between the two vibrating arms 230, 240, in the plan view thereof.

The base section 220 spreads in the XY plane, and has a roughly plate-like shape having a thickness in the Z-axis direction. The base section 220 of the present embodiment has a shrunk-width portion 221 having the width gradually decreasing toward the −Y-axis direction disposed on the opposite side to the arms 230, 240, and 250. Since such a shrunk-width portion 221 is provided, the vibration leakage can be suppressed.

The vibrating arms 230, 240 are disposed side by side in the X direction, and each extend (project) from the base section 220 in the +Y direction. Further, the vibrating arms 230, 240 are provided with hammerheads 260, 270 at the tips thereof, respectively. By providing such hammerheads 260, 270, miniaturization of the resonator element 200 can be achieved, and the frequency of the flexural vibration of the vibrating arms 230, 240 can be lowered. It should be noted that the hammerheads 260, 270 can be provided if needed, and can be eliminated.

Further, the vibrating arm 230 is provided with a groove 235 having a bottom and opening in one principal surface 231, and a groove 236 having a bottom and opening in the other principal surface 232. Similarly, the vibrating arm 240 is provided with a groove 245 having a bottom and opening in one principal surface 241, and a groove 246 having a bottom and opening in the other principal surface 242. These grooves 235, 236, 245, and 246 are disposed so as to extend in the Y-axis direction, and have the same shape as each other. Therefore, the vibrating arms 230, 240 each have a roughly "H" shaped lateral cross-sectional shape. By forming such grooves 235, 236, 245, and 246, it becomes difficult for the heat generated by the flexural vibration to diffuse (make heat conduction), and the thermoelastic loss can be suppressed in the heat insulating area, which is an area where the flexural vibration frequency (the mechanical flexural vibration frequency) f is higher than a thermal relaxation frequency f0 (f>f0). It should be noted that the grooves 235, 236, 245, and 246 can be provided if needed, and can be eliminated.

The support arm 250 extends from the base section 220 in the +Y-axis direction, and is positioned between the vibrating arms 230, 240. Further, the support arm 250 has an elongated shape, and has a roughly uniform width (length in the X direction) throughout the entire area in the longitudinal direction. It should be noted that the shape (in particular the plan view shape) of the support arm 250 is not particularly limited, and can include a portion with a variation in width in the middle of the support arm in the longitudinal direction thereof.

Further, the support arm 250 is provided with a through hole (a first through hole) 251 penetrating in the thickness direction (the Z-axis direction). The through hole 251 is a hole mainly for introducing an adhesive used for fixing the resonator element 200 to the base substrate 410 (an object). Since the contact area between the resonator element 200 and the adhesive can be increased by introducing the adhesive in the through hole 251, the bonding strength between the resonator element 200 and the base substrate is improved.

The cross-sectional shape (a contour shape) of the through hole 251 is roughly rectangular. It should be noted that the lateral cross-sectional shape of the through hole 251 is not limited to a rectangular shape, but can also be a polygonal shape such as a triangular shape or a pentangular shape, a circular shape, or an elliptical shape.

Further, although the length of the through hole 251 in the X-axis direction and the length thereof in the Y-axis direction are not particularly limited, it is preferable that the length of the through hole 251 in the X-axis direction is longer than the grooves 235, 236, 245, and 246, and further, the length of the through hole 251 in the Y-axis direction is longer than the length of the through hole 251 in the X-axis direction. By setting the length of the though hole 251 in the Y-axis direction to be longer than the length of the through hole 251 in the X-axis direction, in the case of forming the through hole 251 by wet-etching, it is possible to prevent the fin formed in the inner peripheral surface of the through hole 251 in the Y-axis direction from hindering the penetration of the through hole, and further, by setting the length of the through hole 251 in the X-axis direction to be longer than the grooves 235, 236, 245, and 246, the penetration of the through hole 251 can surely be achieved by the wet-etching process performed when forming the outer shape simultaneously from the one principal surface and the other principal surface.

The vibrating substrate 210 is hereinabove explained. Then, the electrodes 300 formed on the vibrating substrate 210 will be explained.

As shown in FIGS. 3A, 3B, and 4, the electrodes 300 include a plurality of first driving electrodes 310, wiring lines 320, 330, 340, and 350 for connecting the plurality of first driving electrodes 310 to each other, a plurality of second driving electrodes 360, and wiring lines 370, 380, and 390 for connecting the plurality of second driving electrodes 360 to each other.

The first driving electrodes 310 are respectively formed on the internal surfaces of the grooves 235, 236 of the vibrating arm 230, and the side surfaces 243, 244 of the vibrating arm 240. The first driving electrode 310 on the groove 235 is connected to the first driving electrode 310 on the side surface 244 via the wiring line 320 formed straddling the upper surface and the side surface of the base section 220, and the first driving electrode 310 on the groove 236 is connected to the first driving electrode 310 on the side surface 244 via the wiring line 330 formed straddling the lower surface and the side surface of the base section 220. It should be noted that the wiring lines 320, 330 are connected to each other on the side surface of the base section 220. Further, the first driving electrode 310 on the side surface 244 is connected to the first driving electrode 310 on the side surface 243 via the wiring line 340 formed on the hammerhead 270. Further, the first driving electrode 310 on the side surface 243 is extracted by the wiring line 350 from the upper surface of the support arm 250 to the through hole 251. The tip portion of the wiring line 350 constitutes a connection section (a first electrically-conductive pad) 351 for achieving the electrical connection to the connection electrode 431 via an electrically-conductive adhesive 451 described later, and the connection section 351 is formed to have a frame-like shape so as to surround the opening of the through hole 251, and at the same time, formed on the inner peripheral surface of the through hole 251. Therefore, the connection section 351 is electrically connected to the wiring line 350 formed on the upper surface (the other principal surface) of the support arm 250 via the through hole 251.

Here, the wiring line 350 extends first from the side surface 243 to the upper surface of the base section 220, and then further extends to the through hole 251 passing through the upper surface of the support arm 250 (in other words, the wiring line 350 extends to the base section 220 passing through the support arm 250). In other words, the wiring line 350 extends to the through hole 251 so as to avoid passing on the side surfaces of the support arm 250. By forming the wiring line 350 so as to avoid passing on the side surfaces of the support arm 250 as described above, the short circuit between the first and second driving electrodes 310, 360 via an electrically-conductive adhesive (a bonding member) 452 can effectively be prevented as described later.

On the other hand, the second driving electrodes 360 are respectively formed on the side surfaces 233, 234 of the vibrating arm 230, and the internal surfaces of the grooves 245, 246 of the vibrating arm 240. The second driving electrode 360 on the groove 245 is connected to the second driving electrode 360 on the side surface 233 via the wiring line 370 formed on the upper surface of the base section 220, and the second driving electrode 360 on the groove 246 is connected to the second driving electrode 360 on the side surface 233 via the wiring line 380 formed on the lower surface of the base section 220. Further, the second driving electrode 360 formed on the side surface 233 is connected to the second driving electrode 360 formed on the side surface 234 via the wiring line 390 formed on the hammerhead 260.

Further, the wiring line 380 is branched into two parts 380', 380" on the lower surface of the base section 220, and one part 380' thus branched is connected to the second driving electrode 360 on the side surface 233 as described above, and the other part 380" extends on the upper surface of the support arm 250 to the base end side of the through hole 251. The tip portion of the part 380" extending on the upper surface of the support arm 250 is increased in width compared to the other part, and constitutes a connection section (an electrically-conductive pad) 381 for achieving the electrical connection to the connection electrode 432 via the electrically-conductive adhesive 452. By disposing the connection section 381 on the base end side of the through hole 251 of the support arm 250, since the excessive approach between the connection section 351 formed in the periphery of the through hole 251 and the wiring line 380 can be suppressed, it is possible to effectively inhibit the short circuit of these components via the electrically-conductive adhesives (the bonding members) 451, 452.

When applying an alternating voltage between the connection sections 361, 281 (the first and second driving electrodes 310, 360), the vibrating arms 230, 240 vibrate at a predetermined frequency in an in-plane direction (in the direction of the XY plane) so as to repeat approach and separation.

The constituent material of the electrodes 300 is not particularly limited, and a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr), and an electrically-conductive material such as indium tin oxide (ITO) can be used.

The resonator element 200 is hereinabove explained. Such a resonator element 200 can be manufactured in the following manner. It should be noted that the manufacturing method explained hereinafter is illustrative only, and it is also possible to manufacture the resonator element 200 using other manufacturing methods.

Firstly, as shown in FIG. 5A, the vibrating substrate 210 is prepared. The vibrating substrate 210 can be manufactured by patterning the Z-cut quartz crystal substrate using the wet-etching process.

Then, as shown in FIG. 5B, a metal film 300' is deposited on the entire surface of the vibrating substrate 210 by, for example, vapor deposition or sputtering, then a photoresist film (a positive photoresist film) is deposited on the metal film 300' and then patterned by an exposure and development process, to thereby form a resist pattern corresponding to the shape of the electrodes 300.

Then, the part exposed from the resist pattern of the metal film 300' is removed by performing wet-etching on the metal film 300' via the resist pattern, and then, the resist pattern is removed. According to the process described above, the resonator element 200 can be obtained as shown in FIG. 5C.

As shown in FIG. 2, the resonator element 200 is supported by and fixed to the base substrate 410 in the support arm 250 via the electrically-conductive adhesives 451, 452. The electrically-conductive adhesive 451 is disposed so as to have contact with both of the connection electrode 431 and the connection section 351 and to electrically connect the connection electrode 431 and the connection section 351 to each other, and the electrically-conductive adhesive 452 is disposed so as to have contact with both of the connection electrode 432 and the connection section 381 and to electrically connect the connection electrode 432 and the connection section 381 to each other. Further, the electrically-conductive adhesive 451 is disposed so as not to have contact with the electrically-conductive adhesive 452 and the parts (e.g., the connection electrode 432 and the wiring line 380) electrically connected to the electrically-conductive adhesive 452, and the electrically-conductive adhesive 452 is disposed so as not to have contact with the electrically-conductive adhesive 451 and the parts (e.g., the connection electrode 431 and the wiring line 350) electrically connected to the electrically-conductive adhesive 451.

As described above, in the resonator 100, since the resonator element 200 is fixed to the base substrate 410 with the two electrically-conductive adhesives 451, 452, the resonator element 200 can be fixed to the base substrate 410 in a stable state. In particular, since the electrically-conductive adhesives 451, 452 are arranged side by side in the Y direction, namely the extending direction of the support arm 250 in the present embodiment, the resonator element 200 can be fixed to the base substrate 410 in a more stable state. It should be noted that since the connection sections 351, 381 are arranged side by side in the Y-axis direction, it is possible to easily arrange the electrically-conductive adhesives 451, 452 side by side in the Y-axis direction.

Further, as shown in FIG. 2, the electrically-conductive adhesive 451 enters the through hole 251, and adheres not only to the connection section 351 but also to the inner surface (the wiring line 350 formed on the inner surface) of the through hole 251. Therefore, the contact area with the resonator element 200 can more largely be obtained, and thus, it is possible to increase the bonding strength with the base substrate 410, and to fix the resonator element 200 to the base substrate 410 in a more stable state. Further, since the large contact area between the electrically-conductive adhesive 451 and the wiring line 350 can be assured, electrical conduction between the electrically-conductive adhesive 451 and the wiring line 350 can surely be achieved.

Further, by the electrically-conductive adhesive 451 entering the through hole 251, the electrically-conductive adhesive 451 can be inhibited from spreading in the in-plane direction, namely the direction of the XY plane. Therefore, the short circuit between the electrically-conductive adhesive 451 and the electrically-conductive adhesive 452 (including the parts electrically connected to the electrically-conductive adhesive 452 such as the connection electrode 432 or the wiring line 380) can effectively be prevented, and thus the resonator 100 is made superior in reliability.

Further, in the present embodiment, the wiring line 350 is formed on the upper surface of the support arm 250, but is not formed on the lower surface and the side surfaces of the support arm 250. The lower surface and the side surfaces of the support arm 250 are each an area apt to have contact with the electrically-conductive adhesive 452, and therefore, by preventing the wiring line 350 from being formed in such areas, the short circuit (i.e., the short circuit between the first and second driving electrodes 310, 360) between the electrically-conductive adhesive 452 and the wiring line 350 can more surely be prevented. Therefore, the resonator 100 can be made superior in reliability.

Second Embodiment

Then, another resonator according to a second embodiment of the invention will be explained.

Figure 6:
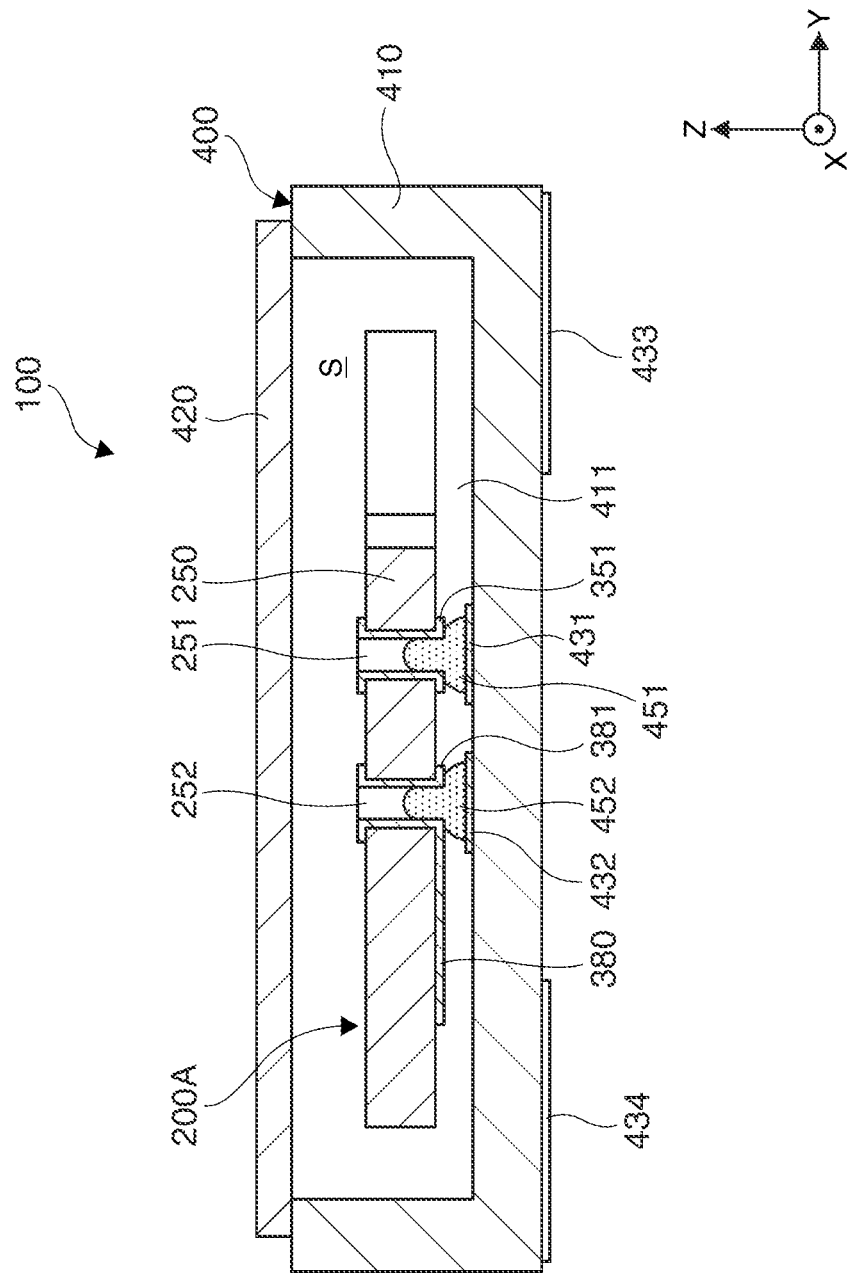
FIG. 6 is a cross-sectional view of a resonator according to a second embodiment of the invention.
Figure 7:
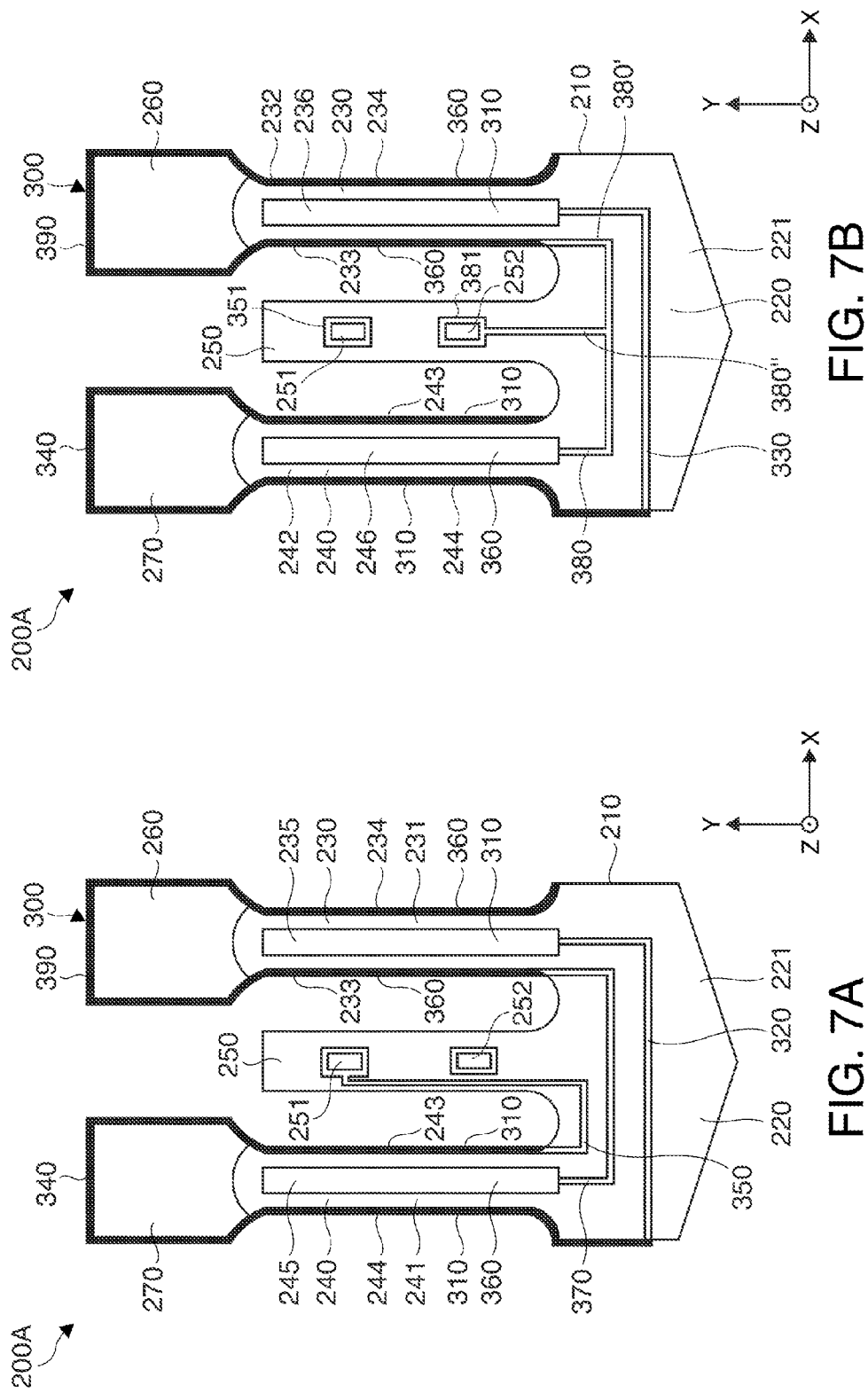

FIG. 6 is a cross-sectional view of the resonator according to the second embodiment of the invention. FIGS. 7A and 7B are plan views of a resonator element provided to the resonator shown in FIG. 6, wherein FIG. 7A is a top view, and FIG. 7B is a bottom view (a transparent view).

Hereinafter, the second embodiment will be described mainly focused on the differences from the embodiment described above, and the explanation of substantially the same matters will be omitted.

The resonator according to the second embodiment is substantially the same as the resonator according to the first embodiment except the point that the configuration of the resonator element is different, specifically the point that the number of the through holes provided to the support arm and the arrangement of the electrodes in accordance with the difference in the number of the through holes are different. It should be noted that in FIGS. 6, 7A, and 7B, the components substantially identical to those of the first embodiments described above are denoted with the same reference symbols.

As shown in FIGS. 6, 7A, and 7B, in the resonator element 200A, the support arm 250 is provided with two through holes 251, 252 penetrating the support arm 250 in the thickness direction (the Z-axis direction) arranged side by side in the Y-axis direction. Further, the through hole (a second through hole) 252 is located closer on the base end side of the support arm 250 than the through hole 251. Further, the through holes 251, 252 are arranged to have substantially the same shape and size as each other.

Further, the part 380" branched from the wiring line 380 extends to the through hole 252 passing through the lower surface of the support arm 250. Further, the connection section (the second electrically-conductive pad) 381 provided to the tip portion of the part 380" is formed to have a frame shape so as to surround the opening of the through hole 252, and at the same time, formed on the inner peripheral surface of the through hole 252.

In the state in which such a resonator element 200A is fixed to the base substrate 410 with the electrically-conductive adhesives 451, 452, the electrically-conductive adhesive 452 enters the through hole 252 similarly to the electrically-conductive adhesive 451. Therefore, the larger contact area between the electrically-conductive adhesive 452 and the resonator element 200A can be assured, and thus, the resonator element 200A can be fixed to the base substrate 410 in a more stable state. Further, since the electrically-conductive adhesive 452 is inhibited from spreading in the in-plane direction, namely the direction of the XY plane, by the electrically-conductive adhesive 452 entering the through hole 252, the contact between the electrically-conductive adhesives 451, 452 can effectively be prevented, and thus, the resonator 100 can be made superior in reliability. Further, since the large contact area between the electrically-conductive adhesive 452 and the connection section 381 can be assured, electrical conduction between the electrically-conductive adhesive 452 and the connection section 381 can surely be achieved.

Third Embodiment

Then, another resonator according to a third embodiment of the invention will be explained.

Figure 8:
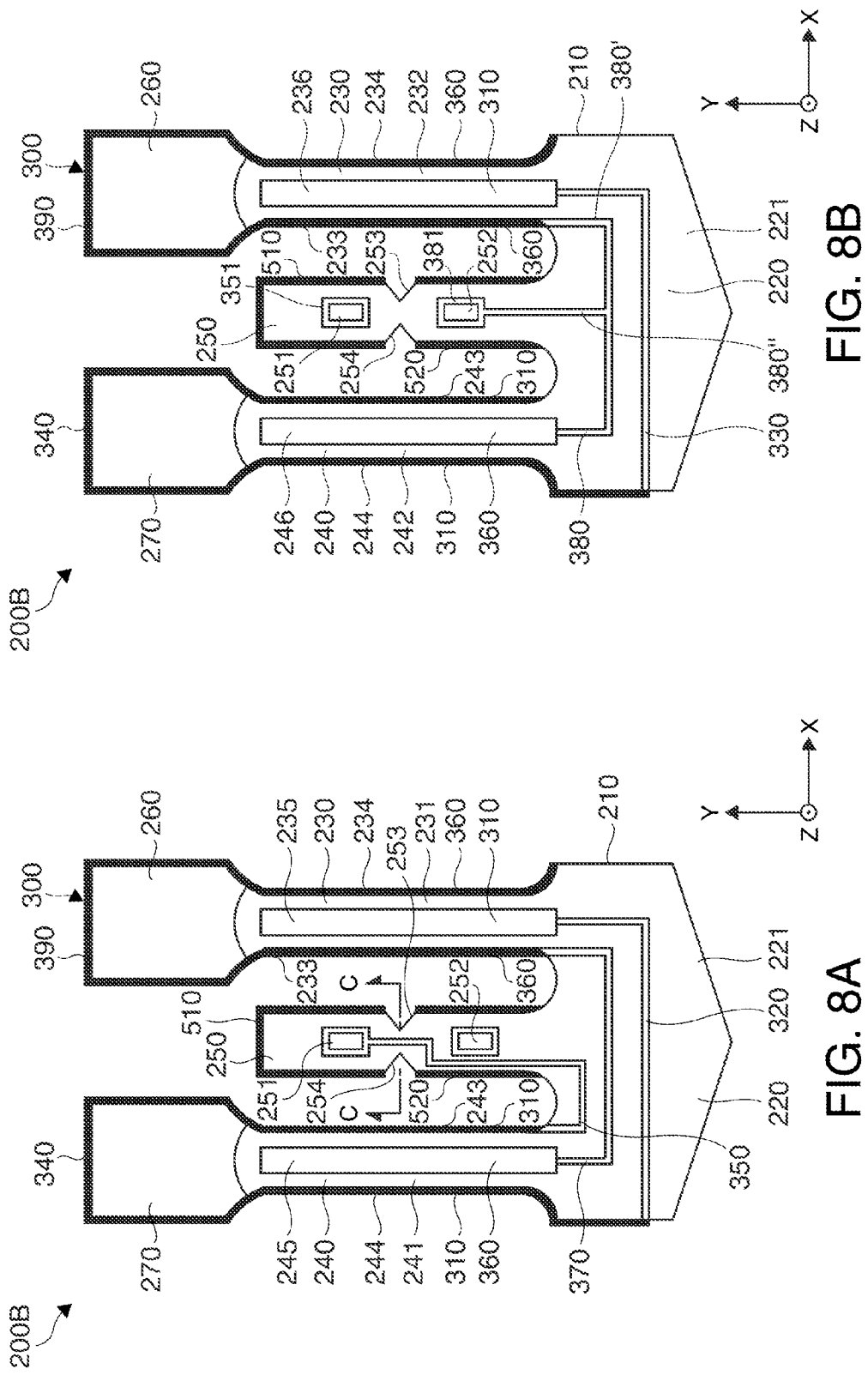
Figure 9:
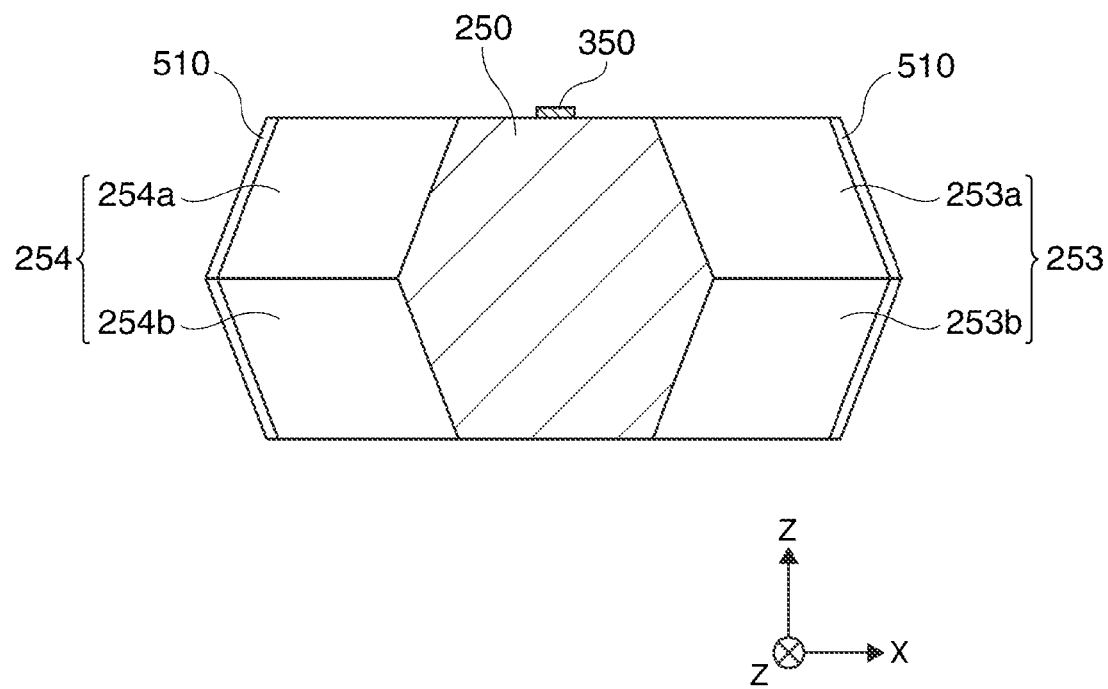
FIG. 9 is a cross-sectional view along the C-C line in FIG. 8A.
Figure 10A:
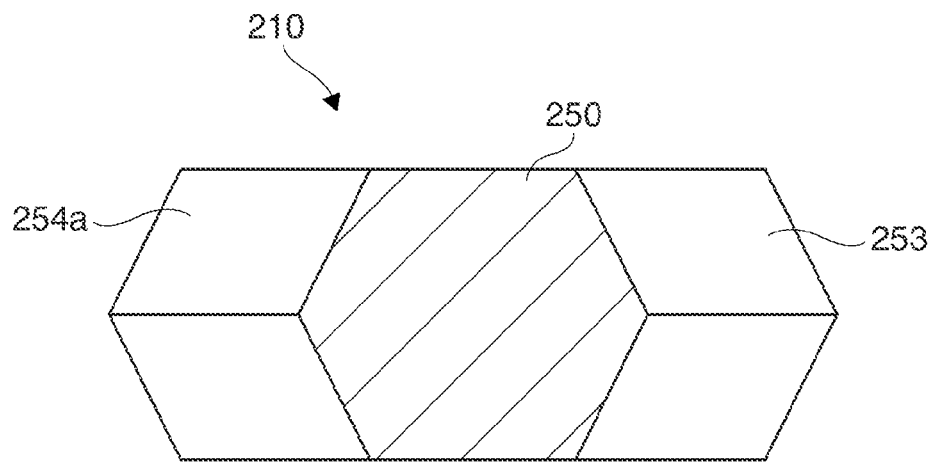
FIGS. 10A through 10C are cross-sectional views for explaining a method of manufacturing the resonator element shown in FIGS. 8A and 8B.
Figure 10B:
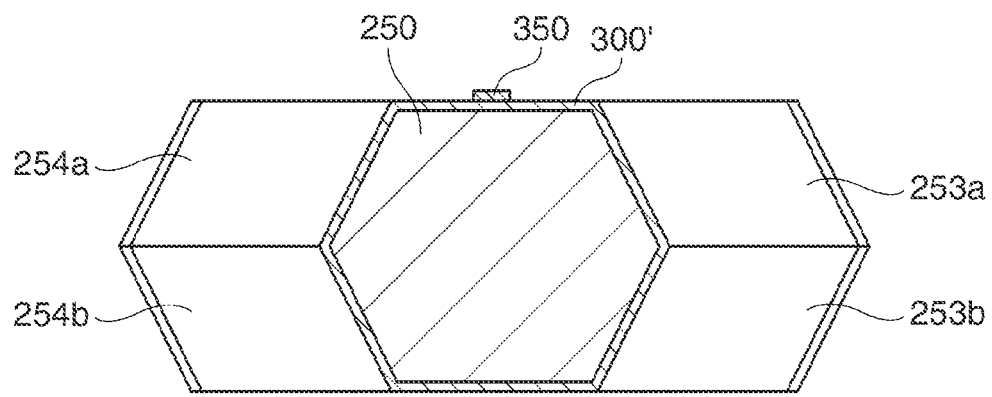
Figure 10C:
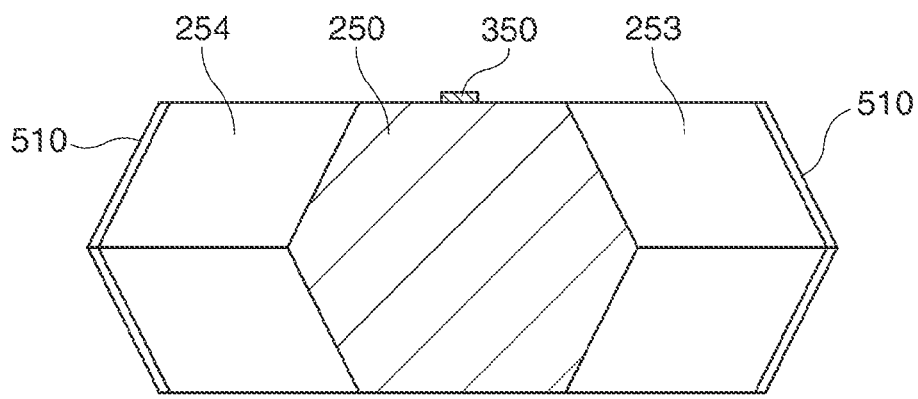

FIGS. 8A and 8B are plan views of a resonator element provided to the resonator according to the third embodiment of the invention, wherein FIG. 8A is a top view, and FIG. 8B is a bottom view (a transparent view). FIG. 9 is a cross-sectional view along the C-C line in FIG. 8A. FIGS. 10A through 10C are cross-sectional views for explaining a method of manufacturing the resonator element shown in FIGS. 8A and 8B.

Hereinafter, the third embodiment will be described mainly focused on the differences from the embodiments described above, and the explanation of substantially the same matters will be omitted.

The resonator according to the third embodiment is substantially the same as the resonator according to the second embodiment described above except the point that the configuration (the shape of the support arm) of the resonator element is different. It should be noted that in FIGS. 8A, 8B, 9, 10A, and 10B, the components substantially identical to those of the embodiments described above are denoted with the same reference symbols.

As shown in FIGS. 8A and 8B, the resonator element 200B is provided with substantially V-shaped notches (cutout sections) 253, 254 opening respectively to the both side surfaces formed in the middle of the support arm 250 in the extending direction thereof and between the through holes 251, 252. Further, as shown in FIG. 9, the notches 253, 254 are each formed of a pair of surfaces tilted with respect to the XY plane, namely upper surfaces 253a, 254a, and lower surfaces 253b, 254b. It should be noted that the notches 253, 254 each having such a shape can easily and surely be obtained by forming the notches 253, 254 using, for example, wet-etching.

Further, the side surfaces of the support arm 250 are provided with two metal films 510, 520. The metal film 510 out of these metal films is formed on the tip side of the notches 253, 254, and the metal film 520 is formed closer on the base end side than the notches 253, 254. In other words, the metal films 510, 520 are separated by the notches 253, 254. Further, the metal films 510, 520 are not connected electrically to the electrodes 300, but are kept in an electrically floating state.

According to the resonator element 200B with such a configuration, substantially the same advantages as in the first embodiment described above can be obtained, and at the same time, it becomes easy to form the electrodes 300. Hereinafter, the reason of the above will be explained together with a method of manufacturing the resonator element 200B. It should be noted that FIGS. 10A through 10C are the cross-sectional views each showing the same cross-section (the cross-section along the C-C line) as shown in FIG. 9.

Firstly, as shown in FIG. 10A, the vibrating substrate 210 is prepared. The vibrating substrate 210 can be manufactured by patterning the Z-cut quartz crystal substrate using the wet-etching process.

Then, as shown in FIG. 10B, a metal film 300' is deposited on the entire surface of the vibrating substrate 210 by, for example, vapor deposition or sputtering, then a photoresist film (a positive photoresist film) is deposited on the metal film 300' and then the photoresist film is patterned by an exposure and development process, to thereby form a resist pattern corresponding to the shapes of the electrodes 300, the metal films 510, 520.

Here, in the exposure process, it is necessary to irradiate each of the upper surface, the lower surface, and the side surfaces of the vibrating substrate 210 with the exposure light. Among these surfaces, the exposure of the upper surface and the lower surface can easily be performed by applying the exposure light from the upper surface side and the lower surface side. In contrast, although the exposure of the side surfaces requires the exposure light to be applied obliquely from the upper surface side or the lower surface side, since the side surfaces are different in direction depending on the location, it is necessary to perform the oblique exposure a plurality of times in accordance with the side surfaces different in direction from each other. Therefore, it takes a lot of trouble to form the resist pattern.

In this point, according to the resonator element 200B of the present embodiment, since the metal film 300' formed on the side surfaces of the support arm 250 is not removed but is left as the metal films 510, 520, the oblique exposure on the side surfaces of the support arm 250 can be eliminated, and thus, the number of times of the oblique exposure can be reduced. Therefore, the reduction of the forming process of the resist pattern can be achieved, and it becomes easy to form the electrodes 300.

Further, although it is necessary to irradiate the notches 253, 254 with the exposure light in order to divide the metal film 300' into the metal films 510, 520, since the upper surfaces 253a, 254a of the notches 253, 254 are tilted, the irradiation of the corresponding part with the exposure light can be performed together with the irradiation of the upper surface with the exposure light. Similarly, since the lower surfaces 253b, 254b are tilted, the irradiation of the corresponding part with the exposure light can be performed together with the irradiation of the lower surface with the exposure light. In other words, since the irradiation of the notches 253, 254 with the exposure light can be performed without increasing (the number of times of) the exposure process, reduction of the forming process of the resist pattern can be achieved, and it becomes easy to form the electrodes 300.

Then, the part exposed from the resist pattern of the metal film 300' is removed by performing wet-etching via the resist pattern thus formed as described above, and then, the resist pattern is removed. According to the process described above, the resonator element 200B can be obtained as shown in FIG. 10C.

In the state in which such a resonator element 200B is fixed to the base substrate 410 with the electrically-conductive adhesives 451, 452, although there is a possibility that the electrically-conductive adhesive 451 spreads to the side surfaces of the support arm 250 and has contact with the metal film 510, and similarly the electrically-conductive adhesive 452 spreads to the side surfaces of the support arm 250 and has contact with the metal film 520, since these metal films 510, 520 are both the films in the electrically floating state as described above, and are further separated from each other, unwanted short circuit and so on do not occur, and the reliability of the resonator 100 is not affected.

Fourth Embodiment

Then, another resonator according to a fourth embodiment of the invention will be explained.

Figure 12:
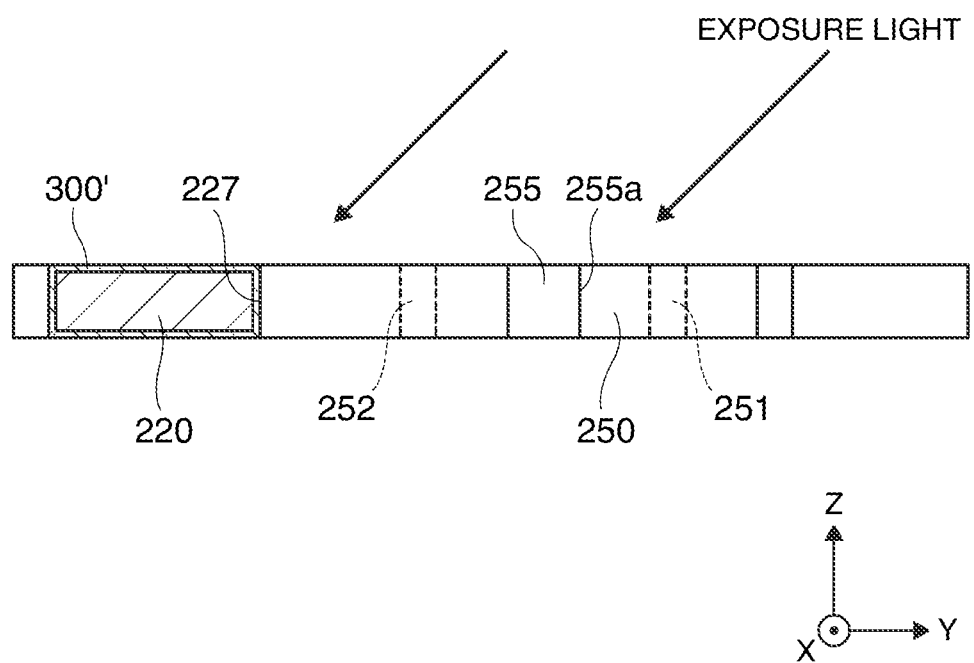
FIG. 12 is a cross-sectional view (a cross-sectional view corresponding to a cross-sectional view along the D-D line in FIG. 11A) for explaining a method of manufacturing the resonator element shown in FIGS. 11A and 11B.

FIGS. 11A and 11B are plan views of a resonator element provided to the resonator according to the fourth embodiment of the invention, wherein FIG. 11A is a top view, and FIG. 11B is a bottom view (a transparent view). FIG. 12 is a cross-sectional view (a cross-sectional view corresponding to a cross-sectional view along the D-D line in FIG. 11A) for explaining a method of manufacturing the resonator element shown in FIGS. 11A and 11B.

Hereinafter, the fourth embodiment will be described mainly focused on the differences from the embodiments described above, and the explanation regarding substantially the same matters will be omitted.

The resonator according to the fourth embodiment is substantially the same as the resonator according to the second embodiment except the point that the configuration (the shape of the support arm) of the resonator element is different. It should be noted that in FIGS. 11A, 11B, and 12, the components substantially identical to those of the embodiments described above are denoted with the same reference symbols.

As shown in FIGS. 11A and 11B, the resonator element 200C is provided with projecting sections 255, 256 projecting respectively from the both side surfaces formed in the middle of the support arm 250 in the extending direction thereof and between the through holes 251, 252.

Further, the side surfaces of the support arm 250 are provided with two metal films 530, 540. The metal film 530 is formed on the tip side of the support arm 250, and the metal film 540 is formed on the base end side of the support arm 250. Further, these metal films 530, 540 are separated by the projecting sections 255, 256. Further, the metal films 530, 540 are not connected electrically to the electrodes 300, but are kept in an electrically floating state.

According to the resonator element 200C with such a configuration, similarly to the case of the third embodiment described above, the number of times of the oblique exposure for forming the resist pattern in the manufacturing process is decreased. Specifically, similarly to the case of the third embodiment described above, since the metal film 300' formed on the side surfaces of the support arm 250 is not removed but is left as the metal films 530, 540, the oblique exposure on the side surfaces of the support arm 250 can be eliminated, and thus, the number of times of the oblique exposure can be reduced.

Further, although it is necessary to irradiate the projection sections 255, 256 with the exposure light in order to divide the metal film 300' into the metal films 530, 540, since the tip surface 255a (256a) of the projecting section 255 (256) is directed to the same direction (the +Y-axis direction) as that of the side surface 227 on the tip side of the base section 220, when irradiating this portion with the exposure light, the tip surfaces 255a, 256a can also be irradiated with the exposure light as shown in FIG. 12. As described above, since the irradiation of the projecting sections 255, 256 with the exposure light can be performed without increasing (the number of times of) the exposure process, reduction of the forming process of the resist pattern can be achieved, and it becomes easy to form the electrodes 300.

In the state in which such a resonator element 200C is fixed to the base substrate 410 with the electrically-conductive adhesives 451, 452, although there is a possibility that the electrically-conductive adhesive 451 spreads to the side surfaces of the support arm 250 and has contact with the metal film 530, and similarly the electrically-conductive adhesive 452 spreads to the side surfaces of the support arm 250 and has contact with the metal film 540, since these metal films 530, 540 are both the films in the electrically floating state as described above, unwanted short circuit and so on do not occur, and the reliability of the resonator 100 is not affected.

Fifth Embodiment

Then, another resonator according to a fifth embodiment of the invention will be explained.

Figure 13:
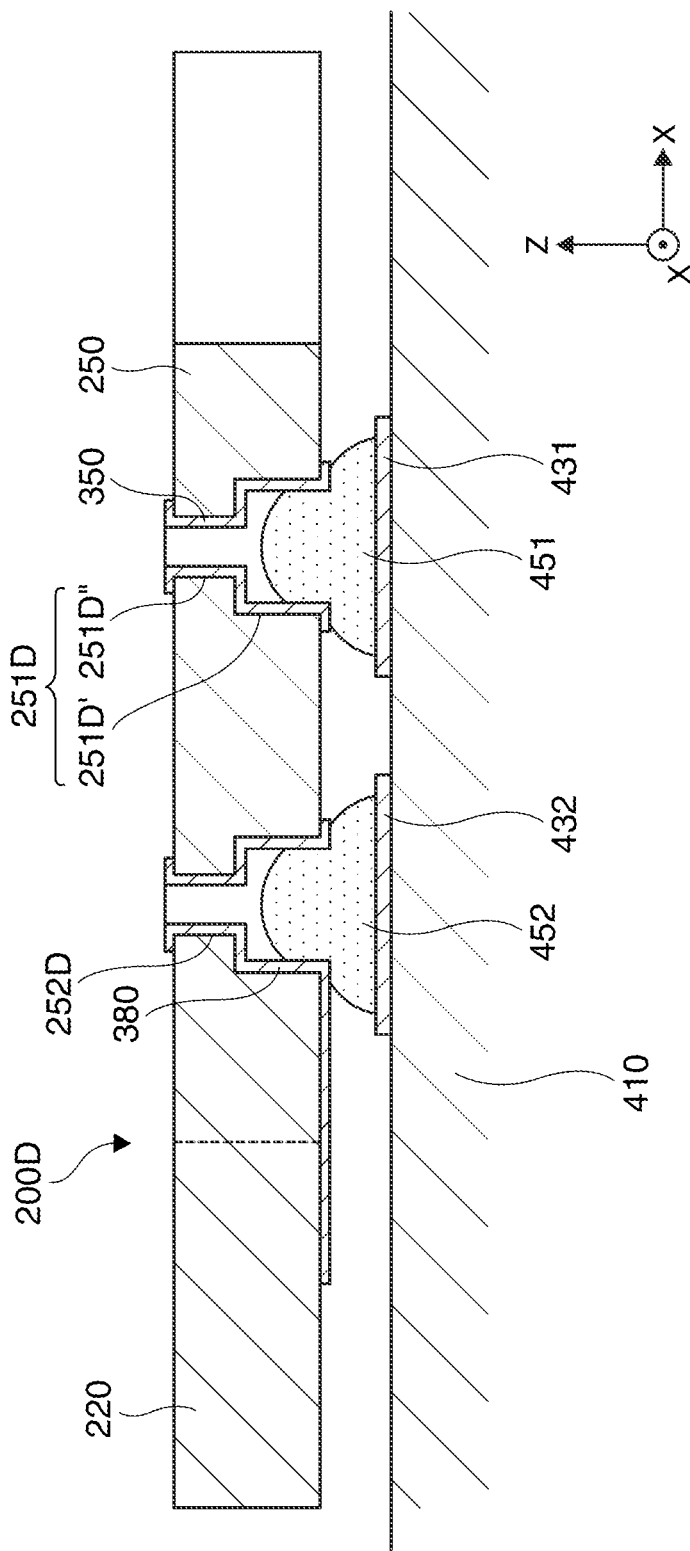
FIG. 13 is a cross-sectional view of a resonator according to a fifth embodiment of the invention.

FIG. 13 is a cross-sectional view of the resonator according to the fifth embodiment of the invention.

Hereinafter, the fifth embodiment will be described mainly focused on the differences from the embodiments described above, and the explanation of substantially the same matters will be omitted.

The resonator according to the fifth embodiment is substantially the same as the resonator according to the second embodiment except the point that the configuration of the resonator element is different, specifically, the point that the shape of each of the through holes is different. It should be noted that in FIG. 13, the components substantially identical to those of the embodiments described above are denoted with the same reference symbols.

In the resonator element 200D shown in FIG. 13, the through hole 251D has a step in the middle thereof, and is formed so that the lateral cross-sectional area on the lower surface side is larger than the lateral cross-sectional area on the upper surface side. Specifically, the through hole 251D has a recessed section 251D' having a bottom and opening in the lower surface of the vibrating substrate 210, and a through hole 251D" penetrating the center portion except the edge portion of the bottom of the recessed section 251D' and the upper surface of the vibrating substrate 210.

By providing the through hole 251D with such a configuration, it is possible to assure the large lateral cross-sectional area on the side to which the electrically-conductive adhesive 451 is introduced, and thus, it is possible to more effectively inhibit the electrically-conductive adhesive 451 from spreading in the in-plane direction of the XY plane. Therefore, it is possible to effectively prevent the unwanted short circuit caused by the contact between the electrically-conductive adhesives 451, 452 and so on. Further, since the lateral cross-sectional area on the upper surface side of the resonator element 200D is set to be smaller, the excessive degradation of the mechanical strength of the resonator element 200D can be prevented.

Although the configuration of the through hole 251D is hereinabove explained, the configuration of the through hole 252D is substantially the same.

According also to the fifth embodiment described above, substantially the same advantages as in the first embodiment described above can be obtained.

Sixth Embodiment

Then, another resonator according to a sixth embodiment of the invention will be explained.

Figure 14:
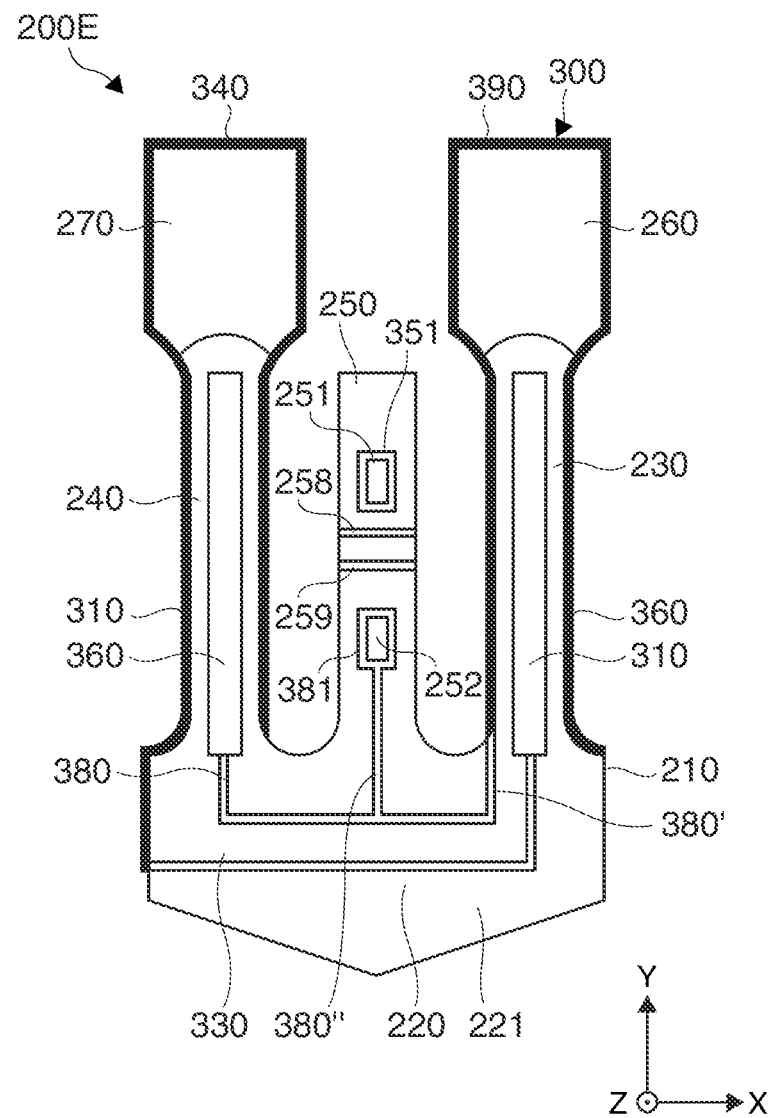
FIG. 14 is a plan view (a transparent view) showing a bottom surface of a resonator element provided to a resonator according to a sixth embodiment of the invention.

FIG. 14 is a plan view (a transparent view) showing a bottom surface of a resonator element provided to the resonator according to the sixth embodiment of the invention.

Hereinafter, the sixth embodiment will be described mainly focused on the differences from the embodiments described above, and the explanation of substantially the same matters will be omitted.

The resonator according to the sixth embodiment is substantially the same as the resonator according to the second embodiment except the point that the configuration of the resonator element is different, specifically, the point that the lower surface of the support arm is provided with grooves. It should be noted that in FIG. 14, the constituents substantially identical to those of the embodiments described above are denoted with the same reference symbols.

The resonator element 200E shown in FIG. 14 is provided with two grooves 258, 259 formed on the lower surface of the support arm 250, and between the through holes 251, 252. The grooves 258, 259 are formed separately in the Y-axis direction from each other, and each extend in the X direction so that the both ends open in the respective side surfaces of the support arm. Such grooves 258, 259 have a function of preventing the contact between the electrically-conductive adhesives 451, 452. In other words, even in the case in which the electrically-conductive adhesive 451 excessively spreads while wetting the lower surface of the support arm 250, the electrically-conductive adhesive 451 enters the groove 258 to thereby be prevented from further spreading to the electrically-conductive adhesive 452 side, and similarly, even in the case in which the electrically-conductive adhesive 452 excessively spreads while wetting the lower surface of the support arm 250, the electrically-conductive adhesive 452 enters the groove 259 to thereby be prevented from further spreading to the electrically-conductive adhesive 451 side, and therefore, the contact between the electrically-conductive adhesives 451, 452 can effectively be prevented.

According also to such a sixth embodiment as described above, substantially the same advantages as in the first embodiment described above can be obtained.

Seventh Embodiment

Then, another resonator according to a seventh embodiment of the invention will be explained.

Figure 15A:
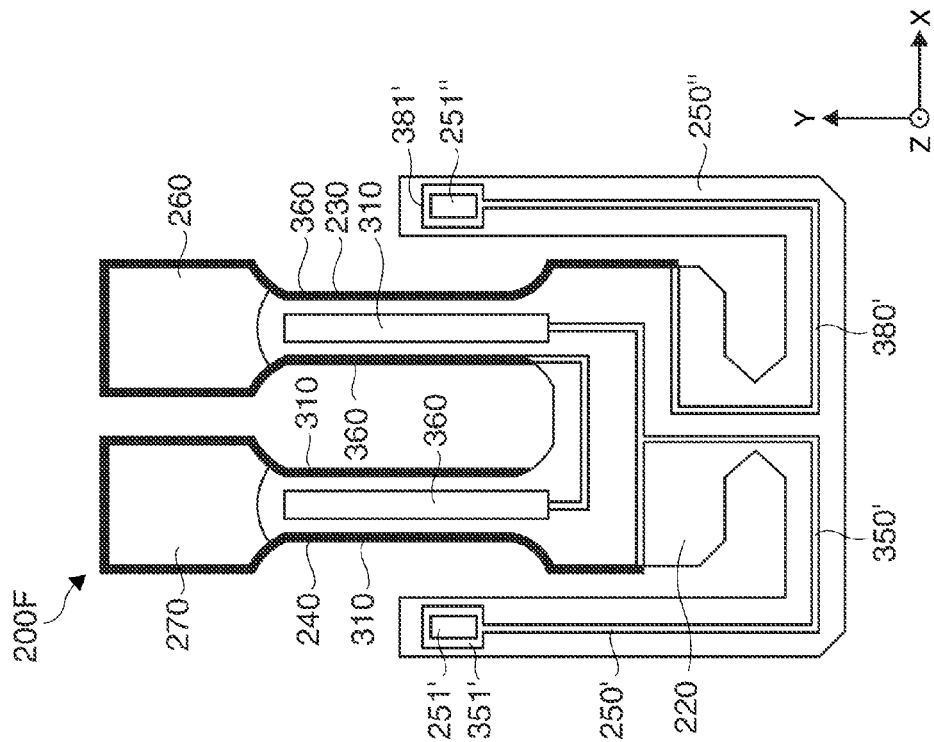
Figure 15B:
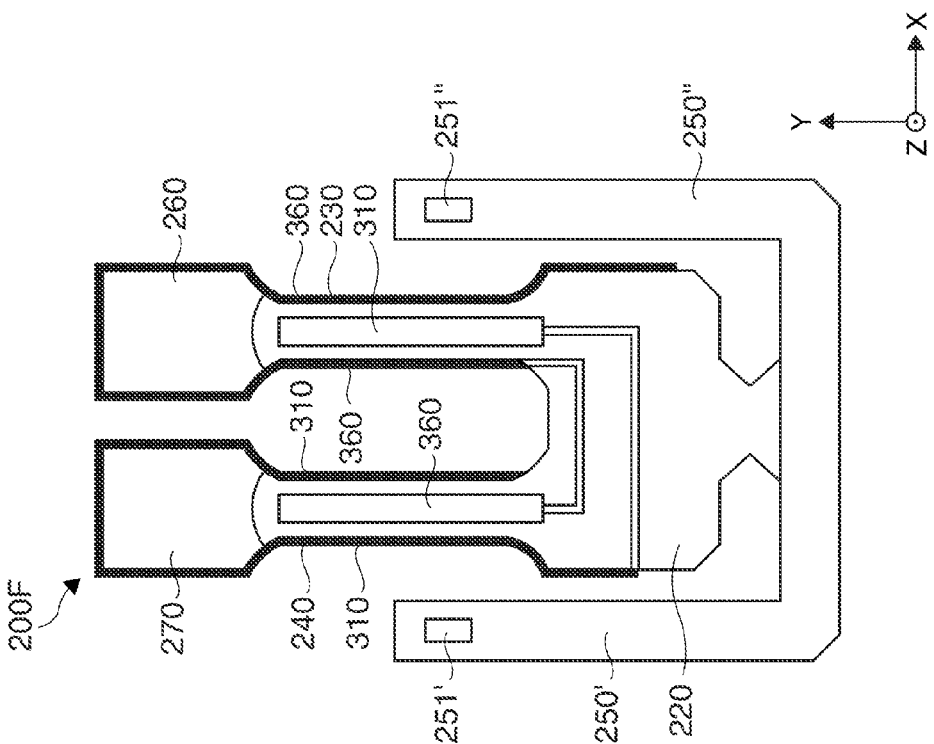

FIGS. 15A and 15B are plan views of a resonator element provided to the resonator according to the seventh embodiment of the invention, wherein FIG. 15A is a top view, and FIG. 15B is a bottom view (a transparent view).

Hereinafter, the seventh embodiment will be described mainly focused on the differences from the embodiments described above, and the explanation of substantially the same matters will be omitted.

The resonator according to the seventh embodiment is substantially the same as the resonator according to the first embodiment described above except the point that the configuration of the resonator element is different, specifically, the point that the configuration of the support arm is different. It should be noted that in FIGS. 15A and 15B, the components substantially identical to those of the embodiments described above are denoted with the same reference symbols.

As shown in FIGS. 15A and 15B, the resonator element 200F has two support arms 250', 250" projecting from the base end side of the base section 220 and branched to both sides in the X-axis direction. The support arms 250', 250" each have a base end portion extending in the X-axis direction and a tip portion extending in the Y-axis direction. Further, the tip portion of each of the support arms 250', 250" is provided with the through holes 251', 251" penetrating in the Z-axis direction.

Further, each of the first driving electrodes 310 is extracted by a wiring line 350' to the through hole 251' passing through the lower surface of the support arm 250', and the tip portion thereof is provided with a connection section 351'. The connection section 351' is formed so as to surround the opening of the through hole 251', and is further formed on the inner peripheral surface of the through hole 251'.

On the other hand, each of the second driving electrodes 360 is extracted by a wiring line 380' to the through hole 251" passing through the lower surface of the support arm 250", and the tip portion thereof is provided with a connection section 381'. The connection section 381' is formed so as to surround the opening of the through hole 251", and is further formed on the inner peripheral surface of the through hole 251".

In the state in which such a resonator element 200F is fixed to the base substrate 410 with the electrically-conductive adhesives 451, 452, the electrically-conductive adhesives 451, 452 respectively enter the through holes 251', 251". Therefore, the larger contact area between the electrically-conductive adhesives 451, 452 and the resonator element 200F can be assured, and thus, the resonator element 200F can be fixed to the base substrate 410 in a more stable state.

According also to such a seventh embodiment as described above, substantially the same advantages as in the first embodiment described above can be obtained.

2. Oscillator

Then, the oscillator (the oscillator according to the invention) to which the resonator element according to the invention is applied will be explained.

Figure 16:
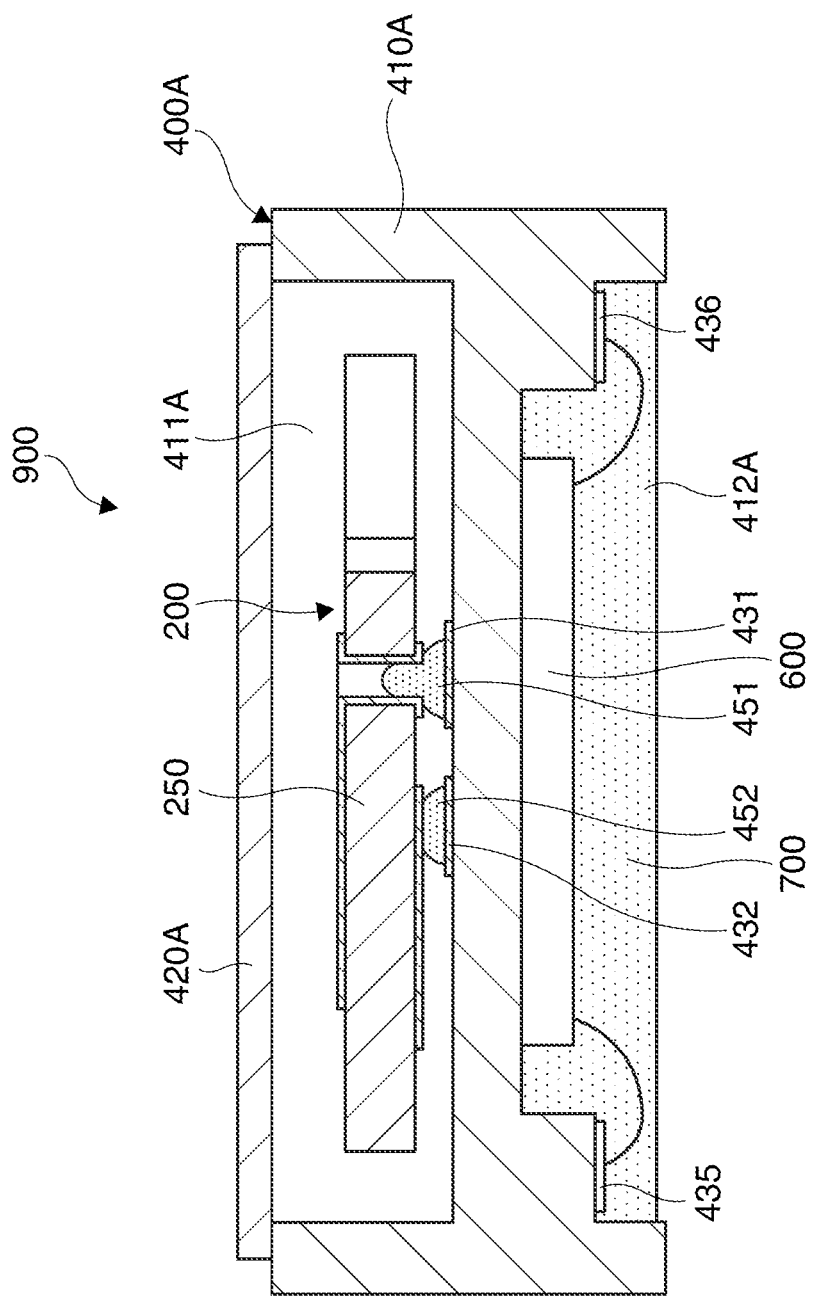
FIG. 16 is a cross-sectional view showing an oscillator equipped with the resonator element according to the invention.

The oscillator 900 shown in FIG. 16 has the resonator element 200, a package 400A for housing the resonator element 200, and an IC chip (a chip part) 600 for driving the resonator element 200.

The package 400A has a base substrate 410A and a lid 420A bonded to the base substrate 410A.

The base substrate 410A has a first recessed section 411A opening in the upper surface, and a second recessed section 412A opening in the lower surface.

The opening of the first recessed section 411A is blocked by the lid 420A, and the resonator element 200 is housed in the inside thereof. Further, two connection electrodes 431, 432 are formed inside the first recessed section 411A. The resonator element 200 housed in the first recessed section 411A is supported by and fixed to the base substrate 410A in the support arm 250 via the pair of electrically-conductive adhesives 451, 452. Further, the one electrically-conductive adhesive 451 is disposed so as to electrically connect the connection electrode 431 and the connection section 351 to each other, and the other electrically-conductive adhesive 452 is disposed so as to electrically connect the connection electrode 432 and the connection section 381 to each other.

On the other hand, the IC chip 600 is housed inside the second recessed section 412A, and the IC chip 600 is fixed to the base substrate 410A via an adhesive. Further, at least two IC connection electrodes 435, 436 are formed inside the second recessed section 412A. The IC connection electrode 435 is electrically connected to the IC chip 600 with a bonding wire, and at the same time, electrically connected to the connection electrode 431 via a penetration electrode and inter-layer wiring not shown. Similarly, the IC connection electrode 436 is electrically connected to the IC chip 600 with a bonding wire, and at the same time, electrically connected to the connection electrode 432 via a penetration electrode and inter-layer wiring not shown. Further, the second recessed section 412A is filled with a resin material 700, and the IC chip 600 is encapsulated with the resin material 700.

The IC chip 600 has a driver circuit (an oscillator circuit) for controlling the drive of the resonator element 200, and by driving the resonator element 200 using the IC chip 600, a signal with a predetermined frequency can be taken out.

3. Electronic Apparatuses

Then, the electronic apparatuses (the electronic apparatuses according to the invention) to which the resonator element according to the invention is applied will be explained in detail with reference to FIGS. 17 through 20.

Figure 17:
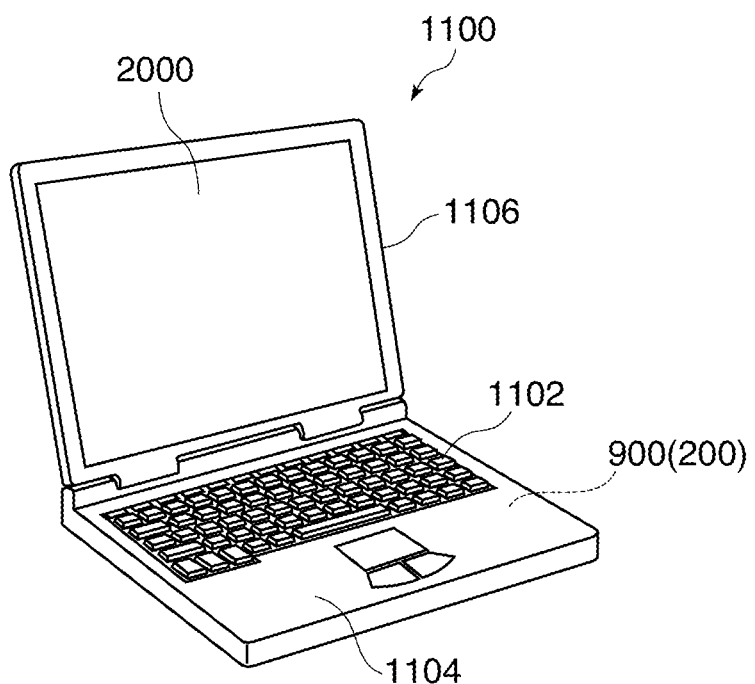
FIG. 17 is a perspective view showing a configuration of a mobile type (or laptop type) personal computer as an example of the electronic apparatus equipped with the resonator element according to the invention.

FIG. 17 is a perspective view showing a configuration of a mobile type (or laptop type) personal computer as an example of the electronic apparatus equipped with the resonator element according to the invention. In the drawing, the personal computer 1100 includes a main body section 1104 provided with a keyboard 1102, and a display unit 1106 provided with a display section 2000, and the display unit 1106 is pivotally supported with respect to the main body section 1104 via a hinge structure. Such a personal computer 1100 incorporates the oscillator 900 (the resonator element 200).

Figure 18:
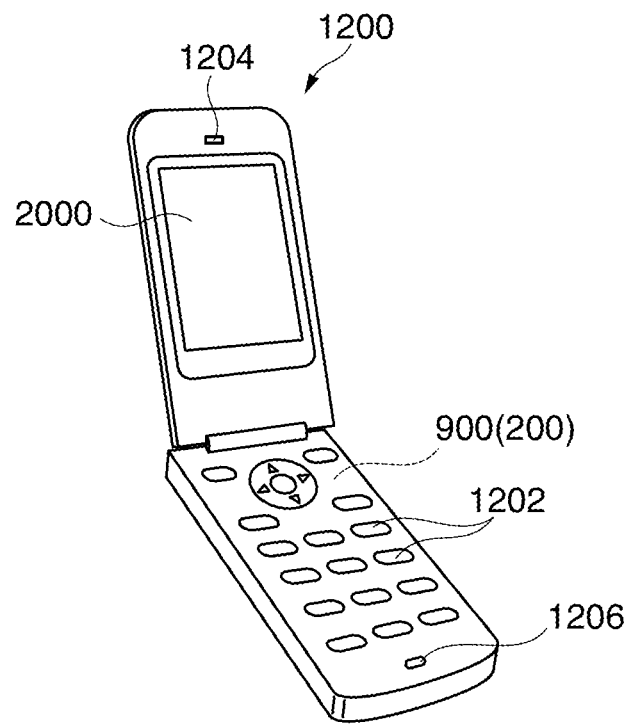
FIG. 18 is a perspective view showing a configuration of a cellular phone (including PHS) as an example of the electronic apparatus equipped with the resonator element according to the invention.

FIG. 18 is a perspective view showing a configuration of a cellular phone (including PHS) as an example of the electronic apparatus equipped with the resonator element according to the invention. In this drawing, the cellular phone 1200 is provided with a plurality of operation buttons 1202, an ear piece 1204, and a mouthpiece 1206, and a display section 2000 is disposed between the operation buttons 1202 and the ear piece 1204. Such a cellular phone 1200 incorporates the oscillator 900 (the resonator element 200).

Figure 19:
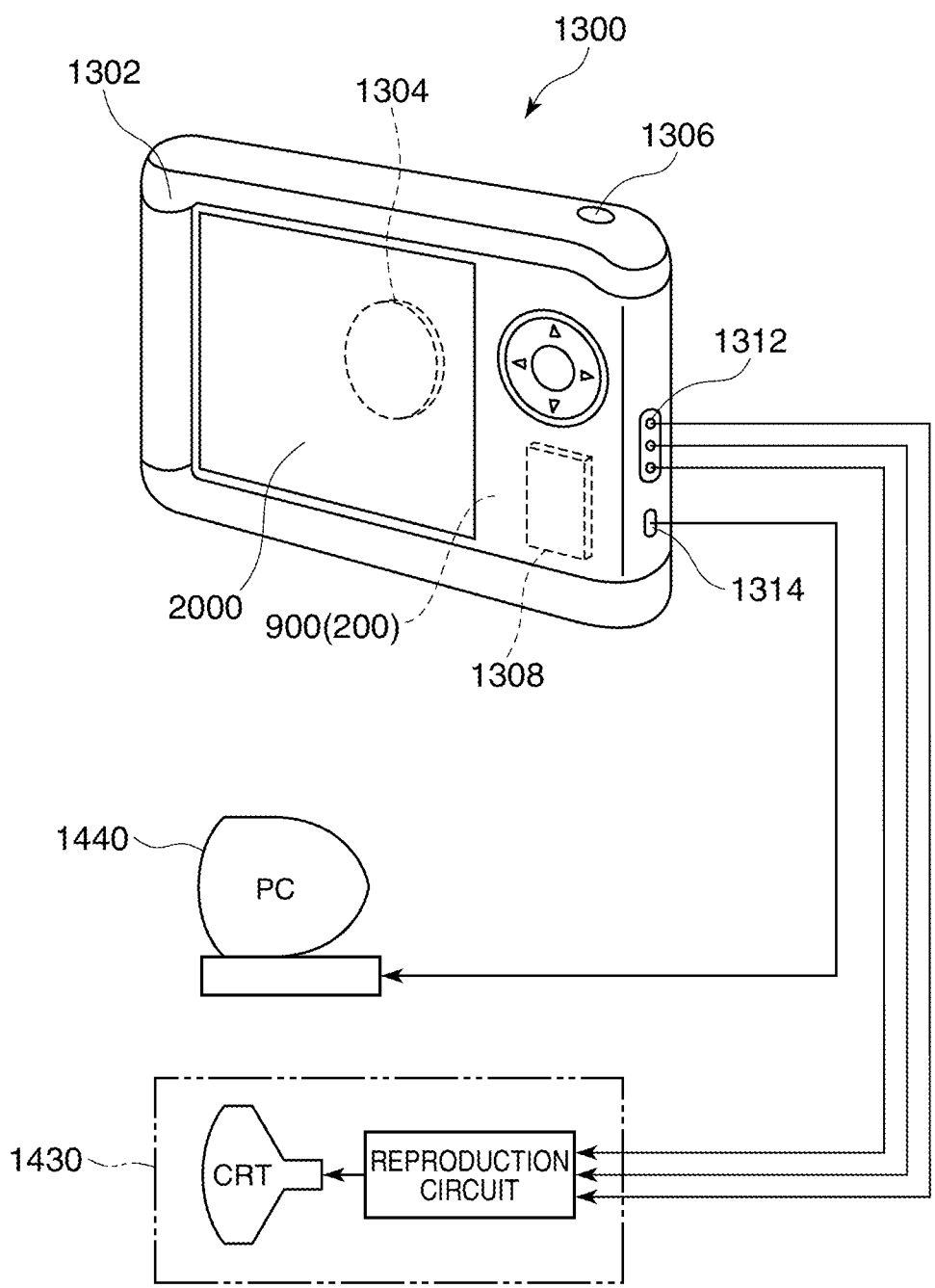
FIG. 19 is a perspective view showing a configuration of a digital still camera as an example of the electronic apparatus equipped with the resonator element according to the invention.

FIG. 19 is a perspective view showing a configuration of a digital still camera as an example of the electronic apparatus equipped with the resonator element according to the invention. It should be noted that connection with external equipment is also shown schematically in this drawing. Here, conventional cameras expose a silver salt film to an optical image of an object, while the digital still camera 1300 performs photoelectric conversion on an optical image of an object by an imaging element such as a CCD (a charge coupled device) to generate an imaging signal (an image signal).

The case (body) 1302 of the digital still camera 1300 is provided with a display section on the back surface thereof to form a configuration of displaying an image in accordance with the imaging signal from the CCD, wherein the display section functions as a viewfinder for displaying an electronic image of the object. Further, the front surface (the back side in the drawing) of the case 1302 is provided with a light receiving unit 1304 including an optical lens (an imaging optical system), the CCD, and so on.

When the photographer confirms an object image displayed on the display section, and then pushes a shutter button 1306 down, the imaging signal from the CCD at that moment is transferred to and stored in the memory device 1308. Further, the digital still camera 1300 is provided with video signal output terminals 1312 and an input-output terminal 1314 for data communication disposed on a side surface of the case 1302. Further, as shown in the drawing, a television monitor 1430 and a personal computer 1440 are respectively connected to the video signal output terminals 1312 and the input-output terminal 1314 for data communication according to needs. Further, there is adopted the configuration in which the imaging signal stored in the memory device 1308 is output to the television monitor 1430 and the personal computer 1440 in accordance with a predetermined operation. Such a digital still camera 1300 incorporates the oscillator 900 (the resonator element 200).

Figure 20:
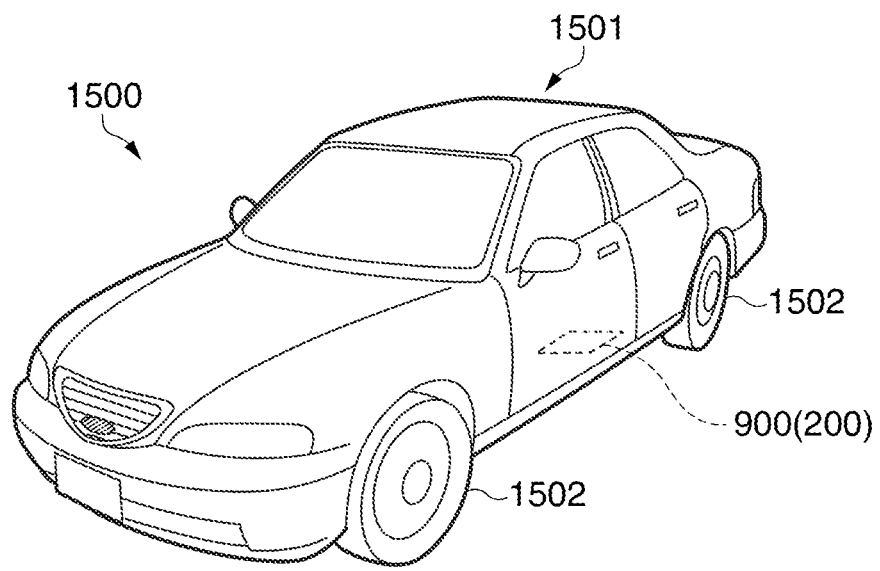
FIG. 20 is a perspective view showing a configuration of a mobile object (a vehicle) as an example of the electronic apparatus equipped with the resonator element according to the invention.

FIG. 20 is a perspective view showing a configuration of a mobile object (a vehicle) as an example of the electronic apparatus equipped with the resonator element according to the invention. In the drawing, the mobile object 1500 has a vehicle body 1501, and four wheels 1502, and is configured to rotate the wheels 1502 by a power source (an engine) not shown provided to the vehicle body 1501. Such a mobile object 1500 incorporates the oscillator 900 (the resonator element 200).

It should be noted that, as the electronic apparatus equipped with the resonator element according to the invention, there can be cited, for example, an inkjet ejection device (e.g., an inkjet printer), a laptop personal computer, a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the personal computer (the mobile personal computer) shown in FIG. 17, the cellular phone shown in FIG. 18, the digital still camera shown in FIG. 19, and the mobile object shown in FIG. 20.

Although the resonator element, the resonator, the oscillator, and the electronic apparatus according to the invention are hereinabove explained based on the embodiments shown in the accompanying drawings, the invention is not limited to these embodiments, but the configuration of each of the components can be replaced with one having an arbitrary configuration with an equivalent function. Further, it is possible to add any other components to the invention. Further, it is also possible to arbitrarily combine any of the embodiments.

Further, the contour of the shrunk-width portion of the embodiment described above can be provided with a projecting section or a recessed section (a cutout).

The entire disclosure of Japanese Patent Application No. 2012-160317, filed Jul. 19, 2012 is expressly incorporated by reference herein.

What is claimed is:

1. A resonator element comprising:
   a base section;
   at least one pair of vibrating arms protruding from the base section;
   a support arm protruding from the base section;
   a first through hole provided to the support arm and penetrating the support arm in a thickness direction between one principal surface and the other principal surface of the support arm, the one principal surface and the other principal surface being in a front-back relationship with each other;
   a first electrically-conductive pad disposed on the one principal surface of the support arm; and
   a wiring line extending from the first electrically-conductive pad to the base section passing through the first through hole and on the other principal surface of the support arm,
   wherein the resonator element is fixed to an object with a bonding material entering the first through hole.

2. The resonator element according to claim 1, further comprising:
   a second electrically-conductive pad disposed at a position closer to a base end of the support arm than the first electrically-conductive pad, and electrically isolated from the first electrically-conductive pad,
   wherein the first electrically-conductive pad is disposed in at least apart of a periphery of the first through hole and on at least a part of an inner peripheral surface of the first through hole.

3. The resonator element according to claim 2, further comprising:
   a second through hole provided to the support arm, penetrating the support arm in the thickness direction, and positioned closer to the base end of the support arm than the first through hole,
   wherein the resonator element is bonded to the object via the first bonding material applied in the first through hole and a second bonding material applied in the second through hole.

4. The resonator element according to claim 3, wherein the second electrically-conductive pad is disposed in at least a part of a periphery of the second through hole and on an inner peripheral surface of the second through hole.

5. A resonator comprising:
   the resonator element according to claim 1; and
   a package housing the resonator element.

6. A resonator comprising:
   the resonator element according to claim 2; and
   a package housing the resonator element.

7. A resonator comprising:
   the resonator element according to claim 3; and
   a package housing the resonator element.

8. A resonator comprising:
   the resonator element according to claim 4; and
   a package housing the resonator element.

9. An oscillator comprising:
   the resonator element according to claim 1; and
   an oscillator circuit electrically connected to the resonator element.

10. An oscillator comprising:
    the resonator element according to claim 2; and
    an oscillator circuit electrically connected to the resonator element.

11. An oscillator comprising:
the resonator element according to claim 3; and
an oscillator circuit electrically connected to the resonator element.

12. An oscillator comprising:
the resonator element according to claim 4; and
an oscillator circuit electrically connected to the resonator element.

13. An electronic apparatus comprising:
the resonator element according to claim 1.

14. An electronic apparatus comprising:
the resonator element according to claim 2.

15. An electronic apparatus comprising:
the resonator element according to claim 3.

16. An electronic apparatus comprising:
the resonator element according to claim 4.

* * * * *